US012612769B2

(12) United States Patent
Jordi et al.

(10) Patent No.: US 12,612,769 B2
(45) Date of Patent: Apr. 28, 2026

(54) PROTECTIVE CAPSULES FOR EARTH MOVING MACHINES

(71) Applicant: METALOGENIA RESEARCH & TECHNOLOGIES, S.L., Barcelona (ES)

(72) Inventors: Marquez Llinas Jordi, Terrassa (ES); Gimeno Tordera Albert, Barcelona (ES); Ferrandiz Borras Vicent, Sant Cugat del Valles (ES)

(73) Assignee: METALOGENIA RESEARCH & TECHNOLOGIES S.L., Barcelona (ES)

( * ) Notice: Subject to any disclaimer, the term of this patent is extended or adjusted under 35 U.S.C. 154(b) by 417 days.

(21) Appl. No.: 18/250,986

(22) PCT Filed: Oct. 28, 2021

(86) PCT No.: PCT/EP2021/080027
§ 371 (c)(1),
(2) Date: Apr. 28, 2023

(87) PCT Pub. No.: WO2022/090411
PCT Pub. Date: May 5, 2022

(65) Prior Publication Data
US 2024/0011254 A1      Jan. 11, 2024

(30) Foreign Application Priority Data

Oct. 28, 2020  (EP) ..................................... 20382939
Feb. 12, 2021  (EP) ..................................... 21382114

(51) Int. Cl.
*E02F 9/26*       (2006.01)
*E02F 9/28*       (2006.01)
*H05K 5/00*       (2006.01)

(52) U.S. Cl.
CPC ........... *E02F 9/267* (2013.01); *H05K 5/0047* (2013.01); *E02F 9/264* (2013.01); *E02F 9/2825* (2013.01)

(58) Field of Classification Search
CPC ......... E02F 9/267; E02F 9/264; E02F 9/2825; E02F 9/2883; E02F 9/2816; E02F 9/285; H05K 5/0047
See application file for complete search history.

(56) References Cited

U.S. PATENT DOCUMENTS 11,773,570 B2 * 10/2023 Hyde .................... E02F 9/2833
                                                    37/456
2015/0284935 A1   10/2015 Egger et al.
(Continued)

FOREIGN PATENT DOCUMENTS

AU      2012215112 A1    8/2013
EP         3327205 A1    5/2018
(Continued)

OTHER PUBLICATIONS

International Search Report for related application PCT/EP2021/080027 prepared by the European Patent Organization and having a mailing date of May 5, 2022.
(Continued)

*Primary Examiner* — Joseph M Rocca
*Assistant Examiner* — Robert E Pezzuto
(74) *Attorney, Agent, or Firm* — Snell & Wilmer LLP

(57) ABSTRACT

A capsule for protecting an electronic device for an earth moving machine, the capsule comprising one or more walls arranged so as to form both an inner chamber configured for housing an electronic device, and an opening through which the inner chamber is accessed, the opening being at least partially covered by a cover, the one or more walls provide the capsule with a geometry that is convex and adapted for
(Continued)

allowing extraction of the capsule from a cavity of the earth moving machine by rotating the capsule. Also, a device for an earth moving machine comprising a cavity and a capsule.

20 Claims, 13 Drawing Sheets

(56)                References Cited

U.S. PATENT DOCUMENTS

| | | | |
|---|---|---|---|
| 2016/0237657 A1* | 8/2016 | Carpenter | ............. E02F 9/2841 |
| 2020/0088617 A1 | 3/2020 | Marquez Llinas et al. | |

FOREIGN PATENT DOCUMENTS

| | | |
|---|---|---|
| EP | 3715537 A1 | 9/2020 |
| WO | 2012107848 A1 | 8/2012 |
| WO | 2012116408 A1 | 9/2012 |
| WO | 2016131015 A2 | 8/2016 |
| WO | 2017017289 A1 | 2/2017 |
| WO | 2020257209 A1 | 12/2020 |

OTHER PUBLICATIONS

Written Opinion of the International Searching Authority for related application PCT/EP2021/080027 prepared by the European Patent Organization and having a mailing date of May 5, 2022.

* cited by examiner

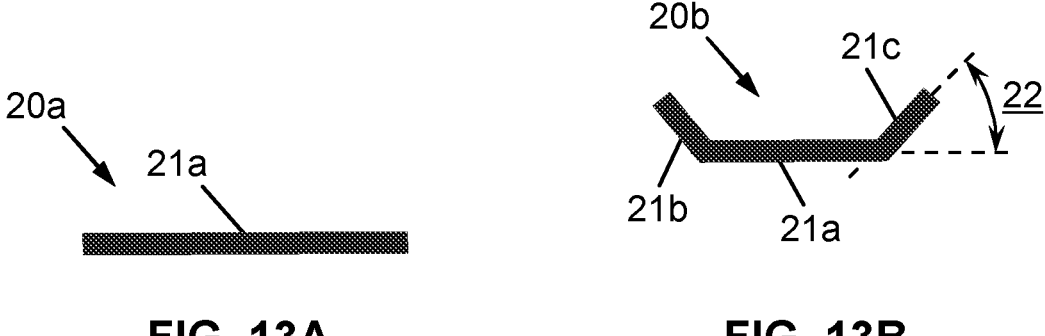
FIG. 13A                    FIG. 13B
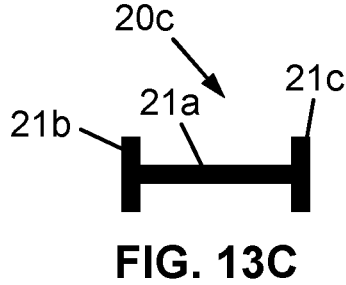
FIG. 13C
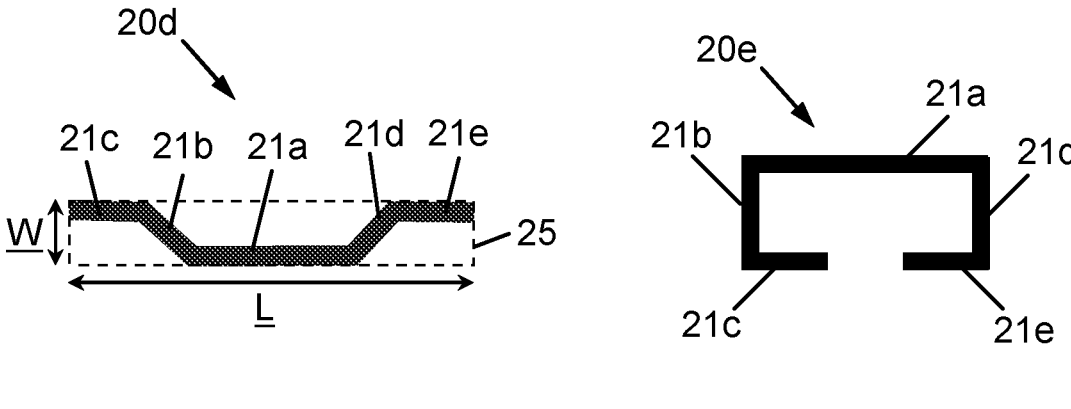
FIG. 13D                    FIG. 13E

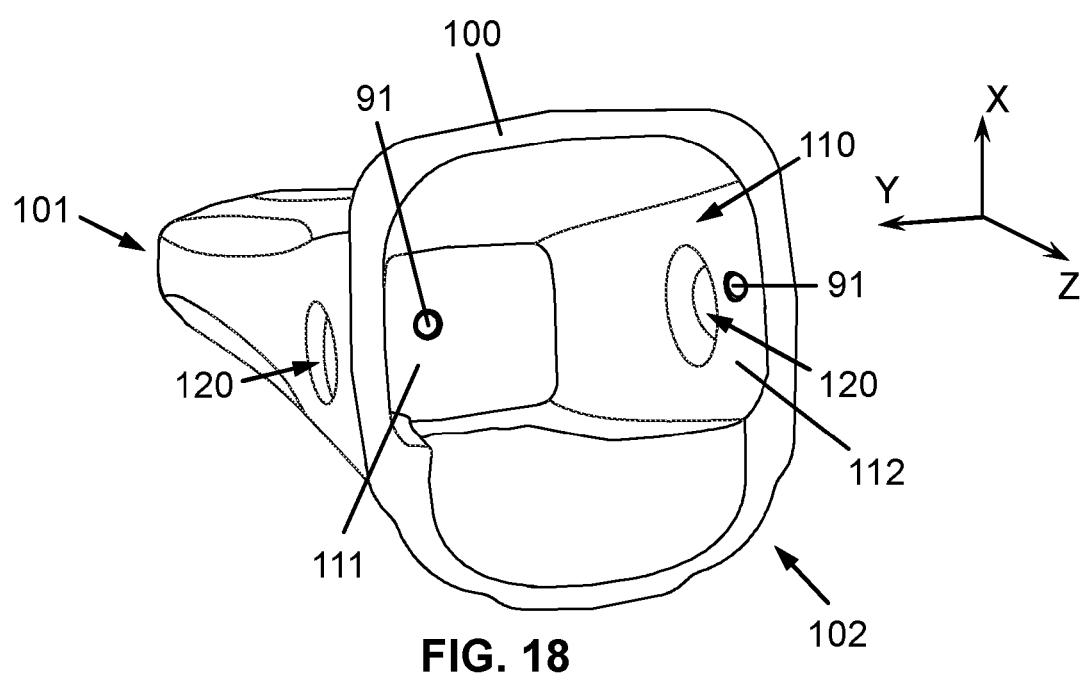
FIG. 18
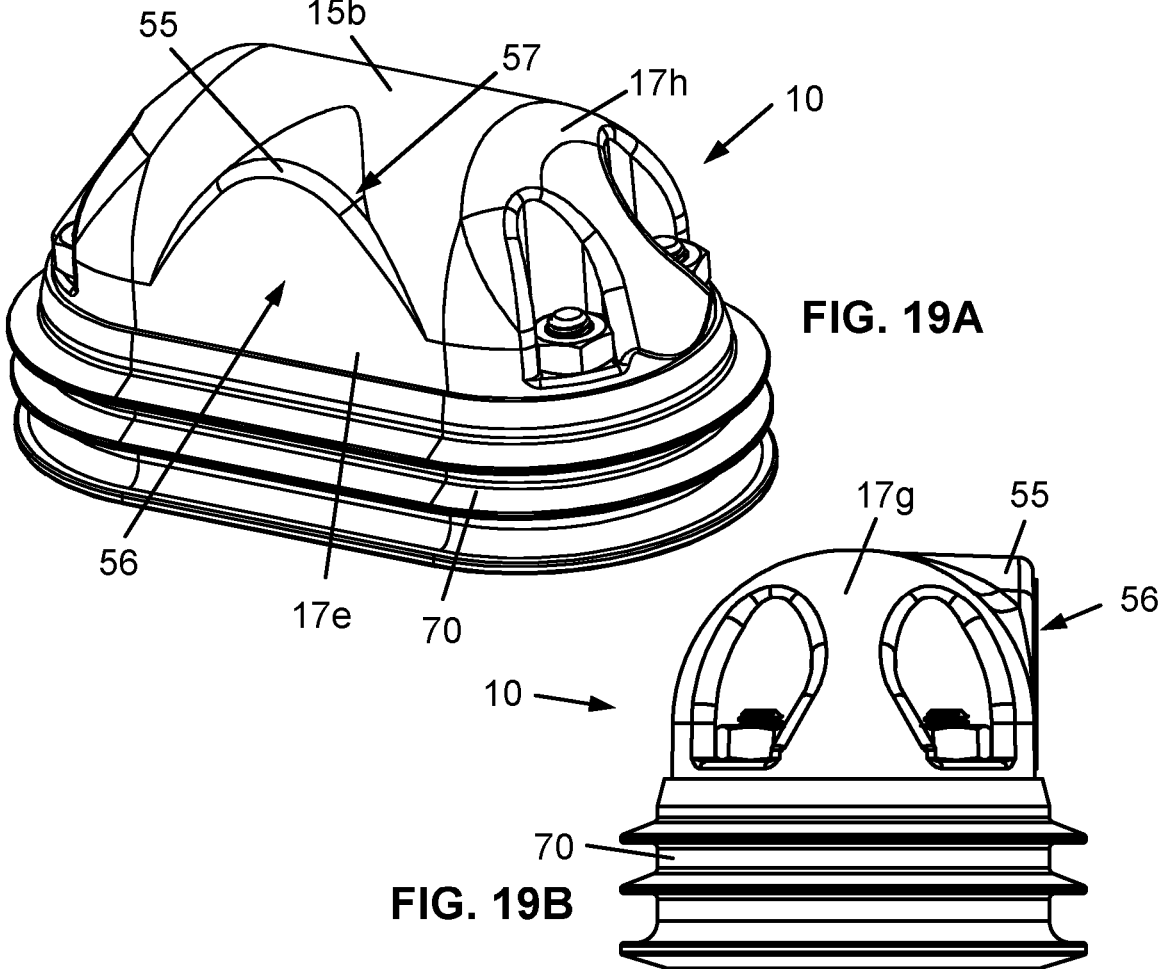
FIG. 19A
FIG. 19B

PROTECTIVE CAPSULES FOR EARTH MOVING MACHINES

TECHNICAL FIELD

The present disclosure relates to the field of earth moving machines. More particularly, the present disclosure relates to capsules for earth moving machines that, for instance, can be introduced in wear elements thereof or the digging implements, to name a few devices of said machines.

STATE OF THE ART

Earth moving machines such as excavators or loaders, for example, comprise digging implements, e.g. bucket, shovel, dredgehead, etc., in which the material is pushed, pulled and/or collected. The digging implements, e.g. the bucket, are subjected to high stresses and significant wear, mainly in the area referred to as blade. For this reason, blades usually have a plurality of protective elements installed thereto which protect the blade and the digging implements against wear. Protective elements also increase the penetration of the digging implements into the terrain and the scratching of the terrain by the digging implements.

All these elements are subjected to intense mechanical requirements, straining and heavy wear. For this reason, they usually must be replaced with certain frequency, when the wear experienced requires it. As a whole, these protective elements are usually referred to as wear elements or ground engaging tools, i.e. GETs.

In order to monitor the wear or any status of the wear elements, the status of other parts of the earth moving machine such as e.g. traction means, boom or stick, or other magnitudes that may influence the ground engaging operations or the machine itself, the different parts of the earth moving machine can include sensing devices that measure said magnitudes, e.g. the strain they are subjected to or any other parameter. However, the measurements and information resulting from processing the same (if any) remain within the location of the sensing devices, e.g. wear elements, traction means, a boom, a stick, a hydraulic cylinder, the digging implements, etc., since that is the location where the electronic devices for sensing are provided. To extract the data, wireless communications links are usually necessary to send the data to a remote device, for example a cabin of the earth moving machine, a control center, an Internet cloud, etc.

Therefore, in addition to the electronic devices for the measurements and as seen for instance in patent documents WO-2017017289-A1, WO-2012107848-A1, US-20150284935-A1 and WO-2012116408-A1, when devices of the machine like wear elements include sensing devices, they typically also include means for radiating and capturing electromagnetic waves such as RFID tags, antennas for near-field communications or antennas in the form of e.g. monopoles, in this way data of the sensing devices can be wirelessly communicated. Regarding the former two, the reach of the electromagnetic waves is usually limited. Regarding the latter, mechanical reliability of said antennas cannot be high enough so as to cope with the stresses that wear elements are subject to; also, the volume that said antennas require may preclude the integration thereof in certain devices like the wear elements, especially the lower the frequency of operation has to be.

Further, the maintenance and dismantlement of capsules for earth moving machines are also problematic. During operation of an earth moving machine the cavities where capsules are typically introduced get deformed as a result of the stresses they are subjected to. This, in turn, results in the narrowing of the cavity or the opening thereof through which the capsule was introduced in the first place. Further, soil and different solids or liquids tend to enter into the parts of the machine where the capsules are arranged. Especially the soil and other solid particles get compacted during operation of the machine and apply pressure on the capsules, which consequently deform. The solids and liquids reaching the capsules affect the mechanical properties of the capsules; the worsening of the mechanical properties can be such that the capsules eventually get damaged or even break, and as a result the device or devices they protect might get damaged and stop working. These problems hinder the extraction of capsules because it is difficult to perform the extraction whenever cavities and capsules have received dirt, fines and have been subject to high pressure.

Accordingly, there is an interest in providing protective capsules for earth moving machine that incorporate an antenna capable of both better withstanding the stresses of devices within earth moving machines and better radioelectric performance. The protective capsules are preferably attachable to or introducible in the devices of the earth moving machines. Further, there is also the interest of providing compact antennas that, in some embodiments, can operate at frequencies below 1000 MHz. Additionally or alternatively, it would be convenient that protective capsules could be extracted with ease whenever they are to be the target of maintenance tasks or are to be dismantled.

SUMMARY

A first aspect of the disclosure relates to a capsule for protecting an electronic device for an earth moving machine, the capsule comprising: walls enclosing an inner chamber configured for housing an electronic device or at least one or more components thereof, and a slot antenna arranged in at least one of the walls.

The capsule makes possible to both protect an electronic device or one or more components thereof, and wirelessly transmit data of the electronic device to an electronic apparatus remote from the capsule and/or wirelessly receive data from a remote electronic apparatus and provide it to the electronic device. By way of example, the electronic device and/or one or more components thereof are, for example but without limitation, one or more sensing devices, one or more batteries, one or more memory units, etc. By way of example, the electronic apparatus can be a controller for supervising and/or operating the earth moving machine, and can be located e.g. in a control center, or in the earth moving machine, for example in a cabin thereof.

The capsule does not require the provision of an antenna such as a monopole, dipole, patch antenna, microchip antenna, etc. that takes space within the inner chamber or has to be attached to the capsule or to another part of the earth moving machine remote from the capsule. Notwithstanding, it is possible to arrange one or more antennas in addition to the slot antenna for wireless transmission and/or reception at frequencies other than the frequencies of operation of the slot antenna, or for redundancy purposes.

The capsule advantageously uses one or more walls thereof for the radiation and/or capturing of electromagnetic waves in order to wirelessly transmit and/or receive data. This, in turn, can make the overall volume needed for both the protection and wireless transmission/reception smaller, the reliability of the communications greater owing to an antenna less prone to damages, and/or the integration of the antenna in the earth moving machine simpler and more reliable too, especially when the capsule is to be introduced in or attached to a wear element, e.g. a tooth, an adapter, a cast lip, or the digging implements, e.g. a bucket. To this end, the capsule is preferably adapted for introduction in a cavity of or attachment to the wear element, the digging implements, a boom, a stick, a hydraulic cylinder, e.g. bucket cylinder, traction means, e.g. continuous tracks, or an underside of a cabin of the earth moving machine.

In some embodiments, the capsule further comprises dielectric material filling the slot of the slot antenna.

The dielectric material can be part of the wall or walls where the slot antenna is formed, be part of one or more components adapted to fill the slot of the slot antenna in a removable manner, for example a removably couplable lid or cap, or be part of a filling material that fills both the slot and the inner chamber with the electronic device therein by way of e.g. a potting process. Concerning the latter, as the material also fills the inner chamber it likewise protects the electronic device within the inner chamber. The dielectric material preferably fills the slot as much as possible so as to hermetically seal the inner chamber, thereby reducing or completely preventing the ingress of particles of the soil, for instance, or other particles capable of short-circuiting or affecting the radioelectric performance of the slot antenna. The dielectric material can be, for instance, epoxy, silicone, plastic, etc.

In some embodiments, the slot antenna is adapted for operation at a frequency less than 3000 MHz. In some embodiments, the frequency is between 2400 MHz and 2500 MHz.

The slot antenna is capable or further capable of radiating and/or capturing electromagnetic waves in e.g. the ISM band of 2.4 GHz to 2.5 GHz.

In some embodiments, the slot antenna is adapted or further adapted for operation at a frequency less than 1000 MHz.

In some embodiments, the frequency is between 430 MHz and 440 MHz. In some embodiments, the frequency is between 433.0 MHz and 435.0 MHz.

In some embodiments, the frequency is between 865.0 MHz and 870.0 MHz. In some embodiments, the frequency is between 900 MHz and 930 MHz.

The slot antenna is capable or further capable of radiating and/or capturing electromagnetic waves at frequencies below 1.0 GHz while being both compact in dimensions and mechanically more durable than antennas such as monopoles or patch antennas.

The slot antenna can radiate and/or capture electromagnetic waves in the ISM band in the frequency range of 430 MHz and 440 MHz, which features lower propagation losses than other bands at higher frequencies, and/or in one or more ISM bands within the frequency ranges of 865 MHz and 870 MHz, and 900 MHz and 930 MHz.

In some embodiments, at least one of the walls has a maximum length, i.e. the greatest dimension of the at least one of the walls where the slot antenna is arranged, in a particular longitudinal direction, a maximum width in a particular first transversal direction and a thickness in a second transversal direction, the maximum length is greater than or equal to the maximum width and the slot antenna has a maximum length, i.e. the greatest dimension of the slot antenna on the at least one of the walls, in the longitudinal direction which is at least 60% and is less than or equal to 100% of the maximum length of the at least one of the walls.

The slot antenna can take most of or the entirety of the length of the at least one of the walls for establishing a path for the currents to follow when electromagnetic waves are to be radiated or captured, thereby making possible to lower the frequency of operation of the slot antenna.

In some embodiments, the slot antenna is not a straight slot.

The slot antenna can include a plurality of segments, each segment being connected to one or more other segments along the length thereof such that longitudinal directions of the respective segments forms an angle therebetween, that is to say, two directly adjacent segments are connected such that they are not parallel. In this way, the effective length of the slot antenna that will determine the frequency or frequencies of operation can be increased.

In some embodiments, one or more segments of the plurality of segments of the slot antenna is/are straight. In some embodiments, one or more segments of the plurality of segments of the slot antenna is/are curvilinear.

In some embodiments, the at least one of the walls in which the antenna is arranged is a cover, and the cover can be removably coupled to one or more of the walls of the capsule.

The cover enables personnel to inspect, retrieve and/or replace any devices within the inner chamber after decoupling or detaching the cover. The electronic device can, for example, have one or more memory units in which data generated by circuitry, sensing devices and/or processors of the electronic device, is stored for ulterior processing thereof.

When the capsule is arranged in a wear element, the aforesaid operation or operations can take place whenever the wear element is to be replaced by another wear element owing to the wear and damages suffered by the wear element, either as part of maintenance tasks or upon failure of the concerned wear element or another wear element coupled thereto. The personnel can also replace e.g. a battery of the electronic device when the same has run out of energy rather than altogether replacing the electronic device, even though typically the wear element has a useful life shorter than that of a battery.

When the capsule is arranged in e.g. the digging implements, the boom, the stick, the hydraulic cylinder, the underside of the cabin, or the traction means, the aforesaid operation or operations can take place from time to time when performing maintenance of the earth moving machine or parts thereof, or as part of preventive maintenance tasks, for instance.

In some embodiments, the slot antenna is arranged in one wall of the capsule arranged on a rear end of the capsule.

In preferred embodiments, the capsule is to be arranged in a wear element of the earth moving machine such that the front end is facing towards a front relative of the machine and, thus, towards a ground to be engaged by the earth moving machine during operation of the machine.

In some embodiments, the capsule comprises two walls, the slot antenna being arranged in a first wall thereof and a second wall thereof being shaped according to a container. In some embodiments, the capsule comprises three or more walls, and the second wall and the third and further walls are mechanically coupled to form a container.

The capsule features the inner chamber for protecting the electronic device with just two walls, even though more walls are possible too, that need to be mechanically coupled together. A reduction in the number of walls can be advantageous from a mechanical standpoint because the mechanical coupling of walls oftentimes is the weakest part of a capsule. During operation of the earth moving machine, the strains or stresses applied to the capsule can break the capsule at the weakest part. The portion between the walls where walls are coupled may, in some occasions, has some space after coupling each pair of walls through which soil, be it dry or wet, can be introduced into the inner chamber and damage the protected electronic device.

In some embodiments, the capsule further comprises the electronic device, the electronic device comprises an electric power source; the electronic device is at least configured for wireless data transmission and is electrically connected to the slot antenna; and the inner chamber partially or completely houses the electronic device. In some embodiments, the electronic device is further configured for wireless data reception.

The electronic device or components thereof, while being protected by the capsule, may transmit data it generates or processes to other devices that are remote from the capsule. The electronic device is configured to transmit and/or receive data at the frequency or frequencies that the slot antenna operates. To this end, the electronic device comprises a wireless communications module, e.g. a modem, for transmitting data by means of a communications protocol or standard operating at one or more frequency bandwidths; the capsule also protects the wireless communications module. The communications protocol or standard uses a bandwidth of operation having one or more frequencies that the slot antenna is adapted to radiate and capture electromagnetic waves.

Further, in some cases, the electronic device may also receive data from devices remote from the capsule, such as commands to change the way the electronic device operates, e.g. go into a dormant state, wake up from a dormant state, change the frequency with which the electronic device generates, processes and/or transmits data, change the type of processing applied to the data, etc.

The inner chamber partially houses the electronic device when only one or some components of the electronic device are within the inner chamber, and completely houses the electronic device when the entire device is within the inner chamber.

In some embodiments, the electronic device further comprises at least one sensor configured for sensing changes in a device of the earth moving machine where the capsule is intended to be installed. In some embodiments, the at least one sensor is configured to sense one or more of: strain, wear, pressure, temperature, acceleration, position (e.g. a GPS), material/terrain (for identification thereof), and falling off of a wear element.

The electronic device can process measurements of the at least one sensor and transmit them with the slot antenna to an electronic apparatus for informing about the ground engaging operations, and/or even the status and/or the operation of the concerned part of the machine; for example, when the capsule is within a wear element, the measurements can be indicative of how the wear element is penetrating and/or scratching ground, and/or how worn off the wear element is. Accordingly, the measurements of the at least one sensor can be used for estimating a wear degree of the part or component of the machine having the capsule arranged therein, characteristics of the ground being engaged, an angle of attack with which the wear element is engaging the ground when the wear element receives the capsule, etc. Therefore, the measurements and/or any estimations made therefrom can be used for supervision of the part or component of the machine, predicting maintenance therefor, informing an operator of the earth moving machine or within a control center of the ground engaging operations, controlling the earth moving machine (e.g. adjustments of the angle of attack, adjustments of the trajectory of digging implements when engaging the ground, adjustments of the force applied by the earth moving machine, etc.) by feeding the data to a controller that automatically adjusts operation of the earth moving machine, etc.

In some embodiments, the at least one sensor comprises one or more of: a strain gauge, a pressure gauge, a relative displacement gauge, an optical fiber strip, a piezoelectric strip, a pressure sensor, and an accelerometer.

In some embodiments, the electronic device comprises a PCB. In some embodiments, the PCB is within the inner chamber. In some other embodiments, the PCB is outside of the inner chamber.

The PCB can be within the inner chamber for protection thereof, but it may also be outside in order to reduce the size of the capsule or for making possible to protect other elements of the electronic device, e.g. battery or batteries, sensing devices, etc. When the PCB is outside and the PCB includes a modem, the connection of the modem with the slot antenna can be, for instance, by way of an SMA cable or the like.

In some embodiments, the PCB is flexible, namely is a flex film PCB.

In some embodiments, the capsule has a central axis defining an axial direction, a front end, and a rear end opposite said front end in the axial direction, and comprises a container formed by the one or more walls not having the slot antenna arranged therein, the container extending in the axial direction from the front end and having the inner chamber; and the cover can be removably coupled to the container and is adapted to cover the rear part of the container. In some embodiments, the cover is adapted to form a flange when the cover is coupled to the container.

The cover where the slot antenna is formed is dimensioned such that it provides the capsule with a flange. The cover in form of a flange can simplify the removal of the cover so as to have access to the inside of the inner chamber. The cover can be removably coupled to the container by way of attaching means such as one or more threaded through holes and respective screw(s) or the like to be inserted into said hole or holes. It is noted that attaching means in the form of corresponding one or more threaded holes or thread through holes are also provided on the rear end of the container; the screw(s) is/are inserted into the hole(s) of both the cover and the container in order to couple them both.

In some cases, the rear part of the container is shaped such that it also provides the capsule with a flange, namely, each of the rear part of the container and the cover is shaped to form a flange. The provision of the flange on the rear part of the container can further simplify the coupling and decoupling processes since the attaching means can be arranged in a simpler way owing to the matching shapes of both flanges.

In some embodiments, one or more walls of the capsule (including or not, or being or not the at least one wall with the slot antenna arranged thereon) comprise one or more holes adapted for receiving one or more cables. In some embodiments, the electronic device comprises the one or more cables.

The electronic device within the capsule can be electrically coupled with components thereof (e.g. one or more sensors, a battery, etc.) or another electronic device that are outside of the capsule via a wired physical link in the form of one or more cables. To this end, walls of the capsule may be provided with through holes through which the cable(s) extend, thereby making possible to have one end of the cable(s) within the inner chamber for connection to one or more components of the electronic device, and another end of the cable(s) outside the capsule for connection to the outside component(s) or the another electronic device.

In some embodiments, the walls not having the slot antenna arranged thereon provide the capsule with a protruding geometry, the protruding geometry being convex and adapted for allowing extraction of the capsule from a cavity of the earth moving machine by rotating the capsule.

As explained later on with more detail, the extraction of the capsule from the cavity is simplified by way of the protruding geometry. By applying a torque on the capsule to rotate it, the protruding geometry of the capsule does not collide or has reduced collisions with the geometry of the cavity.

In some embodiments, the at least one wall is on a first end of the capsule and the protruding geometry protrudes towards a second end of the capsule, the second end being opposite the first end.

The electromagnetic waves radiated and captured by the slot antenna are subjected to less propagation losses because the first end is opposite the protruding geometry, which goes inside the cavity.

In some embodiments, the at least one wall comprises one or more protruding surfaces for allowing an extraction tool to apply torque on a respective protrusion for extraction of the capsule from the cavity, the one or more protruding surfaces extending parallel to a largest surface of the at least one wall.

In some embodiments, the capsule further comprises a cap couplable to the cover, the cap comprising one or more protrusions for contacting walls of the cavity. In some of these embodiments, the one or more protrusions comprise a plurality of protrusions, the protrusions being spaced apart and parallel one to each other. In some of these embodiments, the cap is of a material such as, e.g. ethylene propylene diene monomer rubber (EPDM rubber), Hypalon, Viton, polyurethane, etc.; the material preferably features some flexibility.

The cap, owing to its material, introduces negligible propagation losses, if it does introduce any propagation losses at all. Since the cap covers the slot antenna, it prevents the ingress of particles to the inner chamber through the slot antenna, and with the protrusions it increases the friction between the capsule and the cavity so that the capsule remains reliably attached to the cavity.

In some embodiments, the cap is removably couplable to the cover.

In some embodiments, the cap comprises a recess that fits within the one or more protruding surfaces of the cover.

In some embodiments, at least part of the protruding geometry is rounded. In some embodiments, the capsule has a cuboid shape, and at least two opposite edges of the one or more walls are rounded.

In some embodiments, the protruding geometry allows extraction of the capsule from the cavity by rotating the capsule only around one rotation axis.

In some embodiments, the protruding geometry has one or two symmetry planes.

In some embodiments, the cover comprises one or more grooves each adapted to receive a sensor. In some of these embodiments, the capsule further comprises the sensor or sensors, the sensor being a Hall-effect sensor.

In some embodiments, the capsule further comprises a poka-yoke coupling member.

The poka-yoke coupling member can be integrally formed on a wall or the walls of the capsule, preferably on a wall or walls not comprising the slot antenna, or be a separate member mechanically coupled thereto. The poka-yoke coupling member can be a protruding member intended to cooperate with a poka-yoke coupling member of the cavity that receives the capsule, in which case the latter poka-yoke coupling member is a recess. The shapes of the two members match so that the capsule can only be introduced in the cavity with a certain orientation.

A second aspect of the disclosure relates to a device for an earth moving machine, the device comprising a capsule according to the first aspect of the disclosure or the seventh aspect of the disclosure, and a cavity having the capsule arranged therein.

The electronic device protected by the capsule generates and, preferably, processes measurements made at the device, for example the strains exerted on the device. The capsule can be secured to the cavity with attachment means known in the art, for example but without limitation, adhesive, material filling the space between the capsule and the cavity that is preferably flexible, epoxy, foam, etc.

In some embodiments, the device is a fitting or coupling system of wear elements.

The fitting or coupling system is a mechanical attachment between a female portion or cavity of the tooth and the male portion or nose of an adapter. In some embodiments, the cavity is in the adapter and the nose is in the tooth; this kind of couplings are called inverse coupling systems.

In some embodiments, the device is a wear element.

The arrangement of the capsule in one wear element or in another wear element influences both the measurements made, and the propagation of electromagnetic waves owing to the presence of other wear elements, soil and/or both dimensions and material of the wear element itself that interfere with the propagation of the waves.

In some embodiments, the wear element is an adapter, an intermediate adapter, or a cast/weld on nose. Hereafter the term adapter encompasses the adapter of two-part systems, the intermediate adapter of three-part systems, and also a nose welded or casted on the blade and it will be understood that the disclosure encompasses embodiments with all alternatives of systems of wear elements.

Adapters have a first attachment end intended for coupling the adapter with the tooth, and a second attachment end intended for coupling the adapter with the blade or another adapter (usually in the case of an intermediate adapter).

The arrangement of capsules in the adapter or in the cast/weld on nose may result in capsules more cost-effective that in an arrangement of capsules in the teeth. The adapters or the cast/weld on nose are replaced less often than teeth, therefore new capsules need be provided less often than when arranged in the teeth. This, in turn, also reduces the disposal of capsules and/or components thereof, even if they are recycled, but fewer capsules and electronic devices need be produced in the first place.

In some embodiments, the wear element is a tooth. Teeth have a wear end intended for wearing off with use, and an attachment end intended for coupling the tooth to an adapter.

In this sense, the attachment end has a cavity portion adapted for receiving coupling male portion, respectively, of an adapter, an intermediate adapter or cast/weld-on nose (depending on whether the system of wear elements is a two-part system one, e.g. tooth and adapter, a three-part system one, e.g. tooth, intermediate adapter, adapter, or a cast/weld-on nose). The female portion has a cavity for receiving the male portion of the other wear element of the system; the male portion is also known as nose.

In some embodiments, the cavity is arranged inside the female portion, of either the tooth or the second attachment end of the adapter. In some of these embodiments, the cavity is formed on a wall of the nose of the adapter.

The male portion received in the female portion precludes the capsule from moving or falling out from the wear element, in addition to attachment means used to secure the capsule to the cavity. When the cavity is formed on a wall that is closest to the wear end, strain measurements are made more proximate to the wear end, which might result in more precise sensing in some types of sensing, for example strain.

In some embodiments, the cavity is arranged on an external surface of the wear element.

In some embodiments, the cavity is arranged on a surface of the tooth that is at an end opposite the wear end.

The surface with the cavity formed therein is preferably in contact with the adapter whenever the tooth is coupled to the adapter. The adapter protects the capsule from falling out from the tooth. Further, this arrangement results in fewer interfering elements or material that negatively affect the propagation of the electromagnetic waves.

In some embodiments, the cavity is arranged in the male portion. In some of these embodiments, the cavity is on a surface at a front end of the male portion, that is to say, the end more inwardly introduced in the female portion of the receiving wear element. In some other embodiments, the cavity is adjacent to a through hole of the adapter or tooth for receiving a pin for mechanically fastening the adapter with the tooth; in these cases, the cavity is preferably parallel to the through hole.

In some embodiments, the cavity is arranged in the rear portion of the adapter. In some of these embodiments, the cavity is on a surface from which the male portion protrudes in the first attachment end. In some other embodiments, the cavity is on an external surface of the rear portion.

In some embodiments, an outermost surface of the at least one of the walls having the slot antenna arranged therein is flush with a surface of the wear element (i.e. the tooth or the adapter) where an opening of the cavity is formed.

The arrangement of the slot antenna flush with the surface where the opening of the cavity starts advantageously reduces the propagation losses of the electromagnetic waves radiated and/or captured by the slot antenna when compared with the propagation losses when the slot antenna is inside the cavity. Accordingly, the transmission power can be lower than in the latter case, or kept the same yet the power with which the waves will be received will be greater.

In some embodiments, the device is one of: a boom, a stick, a hydraulic cylinder such as e.g. a bucket cylinder, traction means such as e.g. a continuous track, or a cabin.

The capsule protects the electronic device or components thereof to be arranged in the device. Accordingly, in addition to protect the device and/or its components, the capsule enables the wireless transmission and/or reception of data.

Preferably, but not necessarily, the device includes a cavity for receiving and hosting the capsule at least when a location of the capsule on the device is such that the capsule might be exposed to soil and, thus, exposed to wear; the cavity reduces the exposure of the capsule. By way of example, when the device is traction means, the traction means are preferably provided with such a cavity adapted for the capsule.

When the device is a cabin, the capsule is preferably arranged on an underside of the cabin.

In some embodiments, the cavity adapted to receive the capsule has an opening that is L-shaped, that is to say, the opening is formed in the place of two walls that are not parallel.

In some embodiments, a portion of the geometry of the cavity and a geometry of the walls of the capsule not having the slot antenna arranged thereon are both adapted for allowing extraction of the capsule from the cavity by rotating the capsule.

In some embodiments, the portion of the geometry of the cavity has one or two symmetry planes.

In some embodiments, the cavity further comprises a poka-yoke coupling member.

The poka-yoke coupling member can be a recess intended to cooperate with a poka-yoke coupling member of the capsule it receives, which is a protruding member.

A third aspect of the disclosure relates to an earth moving machine comprising one or more capsules according to the first aspect of the disclosure or according to the seventh aspect of the disclosure, and/or one or more devices according to the second aspect of the disclosure or according to the eighth aspect of the disclosure, and/or one or more assemblies according to the eleventh aspect of the disclosure.

The earth moving machine can have one or several capsules introduced in parts thereof so that the electronic device(s) therein processes data and transmits it to one or more electronic apparatuses that are remote from the capsules, and/or so that the electronic device(s) therein processes data and the capsule or capsules are extractable more easily and reliably. When the parts are wear elements, the machine can have the capsules introduced in one, several or all wear elements of a same type, e.g. tooth, adapter, cast lip. Also, the capsules can be introduced in wear elements of different types, e.g. a capsule in one, some or each tooth and a capsule in one, some or each adapter.

In some embodiments, the earth moving machine further comprises both a wireless data receiver and at least one processing unit, which are remote from each of the one or more capsules or from each of the one or more devices, e.g. wear elements.

The earth moving machine can monitor a wear degree of the wear elements in accordance with wireless data signals sent from each capsule. The at least one processing unit is configured to digitally process the wireless data signals and determine a wear degree of the wear element associated with the wireless data signals.

In some embodiments, the at least one processing unit is configured to digitally process wireless data signals so as to one or more of: predict maintenance of the device, e.g. wear element, associated with the wireless data signals, inform an operator of an earth moving machine or within a control center of ground engaging operations of the earth moving machine, and control the earth moving machine (e.g. adjustments of the angle of attack, adjustments of the trajectory of digging implements when engaging the ground, adjustments of the force applied by the earth moving machine, etc.).

A fourth aspect of the disclosure relates to a process of manufacturing a capsule according to the first aspect of the disclosure, the process comprising the step of forming or adding a slot antenna in at least one wall of walls of the capsule.

The slot antenna can be formed such that it has one or more features as described with reference to embodiments of the first aspect of the disclosure. When the at least one wall is electrically conductive, like when comprising e.g. electrically conductive metallic material, the slot antenna is formed by either removing part of the material of the at least one wall or producing the at least one wall with a slot already formed therein. When the at least one wall is not electrically conductive, like when comprising e.g. plastic, a resin, etc., the slot antenna is formed by adding electrically conductive material to the at least one wall such that it comprises a slot therein.

In some embodiments, the process further comprises manufacturing the capsule with a potting process where the potting is carried out in a mold shaped according to the capsule. In some of these embodiments, the mold is the cavity of a device according to the second aspect of the disclosure, that is to say, the mold is a cavity formed in one of: a wear element, a boom, a stick, a hydraulic cylinder, traction means, or a cabin. Further, in some of these embodiments, the method also comprises installing the manufactured capsule in the cavity of the device, and installing the device in an earth moving machine.

The capsule can be produced with a potting process using e.g. a resin like epoxy that provides the walls of the capsule. Then, the slot antenna is formed by adding in at least one of the walls of the capsule an electrically conductive component, i.e. a component with electrically conductive material, that includes the slot.

The potting can be conducted in a mold adapted to this end, or the device where the capsule will be introduced during usage of the earth moving machine can be used as mold as well.

In some embodiments, the potting process is carried out with the electronic device or components thereof introduced in the mold. In this way, the electronic device or said components are included in the capsule during the manufacturing process thereof.

In some embodiments, the process further comprises carrying out a potting process on the manufactured capsule so as to at least fill the slot of the slot antenna with dielectric material. In some of these embodiments, the potting process further fills the inner chamber of the capsule with the electronic device partially or completely introduced therein.

The capsule is manufactured with a different manufacturing process, and once manufactured, it is partially or completely filled with dielectric material by means of the potting process. The dielectric material prevents the ingress of particles within the inner chamber, and may also further protect the contents of the inner chamber when the material fills the inner chamber.

A fifth aspect of the disclosure relates to a process of manufacturing a device, e.g. wear element, according to the second aspect of the disclosure, the process comprising the steps of: forming, on the device, the cavity for receiving a capsule according to the first aspect of the disclosure or according to the seventh aspect of the disclosure; and introducing the capsule in the formed cavity.

The cavity of the device can be formed such that it has one or more features as described with reference to embodiments of the first, second and/or seventh aspect(s) of the disclosure.

A sixth aspect of the disclosure relates to a monitoring system for monitoring a wear degree of a device, e.g. wear element, according to the second aspect of the disclosure, the monitoring system comprising: one or more capsules according to the first aspect of the disclosure, each capsule of the one or more capsules being installed in a different device; a wireless data receiver for receiving wireless data signals from each capsule of the one or more capsules; and at least one processing unit configured to digitally process the wireless data signals so as to determine a wear degree of the device associated with the wireless data signals.

In some embodiments, the monitoring system further comprises a control center, the control center being remote from the one or more capsules and comprising both wireless data receiver and the at least one processing unit.

In some embodiments, the monitoring system further comprises an earth moving machine, the one or more capsules being installed in a different device of the earth moving machine; the earth moving machine comprises both the wireless data receiver and the at least one processing unit, which are remote from each of the one or more capsules.

In some embodiments, the at least one processing unit is further configured to digitally process the wireless data signals so as to one or more of: predict maintenance of the device associated with the wireless data signals, inform an operator of an earth moving machine or within a control center of ground engaging operations of the earth moving machine, and control the earth moving machine (e.g. adjustments of the angle of attack, adjustments of the trajectory of digging implements when engaging the ground, adjustments of the force applied by the earth moving machine, etc.).

A seventh aspect of the disclosure relates to a capsule for protecting an electronic device for an earth moving machine, the capsule comprising one or more walls arranged so as to form both an inner chamber configured for housing an electronic device, and an opening through which the inner chamber is accessed, the opening being at least partially covered by a cover, the one or more walls provide the capsule with a protruding geometry preferably in at least one portion of the capsule, the protruding geometry being convex and adapted for allowing extraction of the capsule from a cavity of the earth moving machine by rotating the capsule.

When capsules in an earth moving machine are to undergo maintenance tasks, for instance for replacement of the electronic device or components thereof, or are to be either dismantled or decommissioned, for instance for recycling the capsule, they first need to be extracted from the cavity they are introduced. The present capsule can be extracted with more ease than other capsules owing to the geometry of the wall or walls thereof. In this sense, the wall or walls can feature a cuboid or prismed shape, for example, that forms a protruding geometry; since the inner chamber is delimited by the wall or walls, the inner chamber protrudes as well.

The rotation of the capsule is about a rotating axis such that, by applying a torque on the capsule to rotate it, the protruding geometry of the capsule does not collide or has reduced collisions with the geometry of the cavity. In this sense, the capsule rotates several degrees so that at least a portion of the capsule protrudes is not lying flat within the cavity and, preferably, protrudes from the cavity, at which point the capsule can be pulled out manually or by means of a pulling device, e.g. claws, pliers, etc.

The rotating axis can be defined by way of e.g. axes of a cross-section of the capsule where the at least one portion starts. Said cross-section of the capsule extends over a plane defined by both the longitudinal axis of the capsule and an axis transverse thereto. The rotating axis is, with such exemplary definition of axes, parallel to the axis transverse to the longitudinal axis. It is readily apparent that the same exact rotating axis can be defined by way of other axes of the capsule, particularly the rotating axis is parallel to the other axes of the capsule used.

An eighth aspect of the disclosure relates to a device for an earth moving machine comprising: a cavity; and a capsule for protecting an electronic device for an earth moving machine, the capsule comprising one or more walls arranged so as to form both an inner chamber configured for housing an electronic device, and an opening through which the inner chamber is accessed, the capsule being introducible in the cavity, the opening being at least partially covered by a cover, the one or more walls provide the capsule with a protruding geometry, the protruding geometry fitting in at least a portion of a geometry of the cavity, and both the protruding geometry and the portion of the geometry of the cavity are adapted for allowing extraction of the capsule from the cavity by rotating the capsule.

The geometries of both the cavity and the capsule are such that rotation of the capsule is possible by applying torque thereto thereby easing the extraction of the capsule. The rotation makes the capsule to change its angle relative to the cavity so that more surface of the capsule is available for pulling the capsule and extract it. Preferably the geometry of the one or more walls is convex, i.e. the protruding geometry is convex.

In some embodiments, the device is one of: a wear element (e.g. tooth, adapter, etc.), digging implements, a boom, a stick, a hydraulic cylinder, traction means, or a cabin.

In some embodiments according to the seventh aspect and/or the device according to the eighth aspect, the cover completely covers the opening.

In some embodiments according to the seventh aspect and/or the device according to the eighth aspect, the cover is removably couplable to the one or more walls to at least partially cover the opening.

The cover thus selectively permits or forbids access to the inner chamber depending on whether the cover is coupled to the one or more walls or not.

In some embodiments of the capsule according to the seventh aspect and/or the device according to the eighth aspect, the cover is on a first end of the capsule and the protruding geometry protrudes towards a second end of the capsule, the second end being opposite the first end.

This arrangement enables both the rotation of the capsule and the access to the inner chamber while the capsule remains introduced in the cavity. Likewise, when a slot antenna is arranged on the cover like in some embodiments, this arrangement can improve the transmission and reception of wireless signals whilst making possible to rotate the capsule. To this end, the first end can face outwardly from the cavity and the second end can face inwardly.

In some embodiments of the capsule according to the seventh aspect and/or the device according to the eighth aspect, the cover comprises one or more protruding surfaces for allowing an extraction tool to apply torque on a respective protrusion for extraction of the capsule from the cavity, the one or more protruding surfaces extending parallel to a largest surface of the cover.

The cover also eases the extraction of the capsule by way of the protruding surface(s), which provide a support surface for the extraction tool to press against and apply a force that produces a torque for rotating the capsule.

In some embodiments of the capsule according to the seventh aspect and/or the device according to the eighth aspect, the capsule further comprises a cap couplable to the cover, the cap comprising one or more protrusions for contacting walls of the cavity. In some of these embodiments, the one or more protrusions comprise a plurality of protrusions, the protrusions being spaced apart and parallel one to each other. In some of these embodiments, the cap is of a material such as, e.g. ethylene propylene diene monomer rubber (EPDM rubber), Hypalon, Viton, polyurethane, etc.; the material preferably features some flexibility.

The protrusion(s) of the cap is/are intended to produce friction between the cap (and, thus, the capsule) and the cavity, thereby maintaining the capsule inside the cavity more reliably; the more protrusions the cap has, the greater the friction can be. Likewise, the cap also prevents the ingress of particles within the inner chamber whenever the cover has an opening formed therein, for instance a slot antenna.

In some embodiments of the capsule according to the seventh aspect and/or the device according to the eighth aspect, the cap is removably couplable to the cover.

In some embodiments of the capsule according to the seventh aspect and/or the device according to the eighth aspect, the cap comprises a recess that fits within the one or more protruding surfaces of the cover.

The provision of the recess improves the coupling between the cap and the cover so that the cap does not fall off.

In some embodiments of the capsule according to the seventh aspect and/or the device according to the eighth aspect, at least part of the protruding geometry is rounded or chamfered. In some embodiments, the capsule has a cuboid shape, and at least two opposite edges of the one or more walls are rounded or chamfered, the opposite edges preferably being the shorter edges of the cuboid.

The rounded or chamfered geometry assists in distributing the loads that the capsule receives during operation of the earth moving machine more evenly throughout the surface of the capsule. In this manner, the useful life of both the capsule and the protected electronic device (when inserted in the inner chamber) is increased.

In some embodiments according to the seventh aspect and/or the device according to the eighth aspect, the protruding geometry allows extraction of the capsule from the cavity by rotating the capsule only around one rotation axis. To this end, in some of these embodiments, one or more edges of the cover and/or part of the one or more walls are perpendicular to the cover. In some of these embodiments, the one or more edges comprise a plurality of edges, and all the edges are parallel (i.e. they extend along a direction).

By allowing the rotation of the capsule only about a single rotation axis, the capsule is maintained more reliably within the cavity of the device since only one rotation is possible. In this regard, the portion of the geometry of the cavity is preferably also adapted to allow the extraction of the capsule by rotating only around the one rotation axis. That is to say, only the tangential direction of the edges (preferably rounded or chamfered) let the capsule rotate to be extracted from the cavity.

In some embodiments of the capsule according to the seventh aspect and/or the device according to the eighth aspect, the cover comprises a slot antenna.

In this sense, the cover comprises or is of an electrically conductive material at least on a portion where the slot antenna is formed. The slot antenna is preferably a slot antenna as described in previous aspects of the disclosure.

In some embodiments of the capsule according to the seventh aspect and/or the device according to the eighth aspect, the protruding geometry has one or two symmetry planes.

In some embodiments of the device according to the eighth aspect, the portion of the geometry of the cavity has one or two symmetry planes.

The existence of symmetry planes in the capsule and/or in the cavity potentially ease the extraction process and/or more evenly distribute loads exerted on the capsule.

In some embodiments of the capsule according to the seventh aspect and/or the device according to the eighth aspect, the cover comprises one or more grooves each adapted to receive a sensor. In some of these embodiments, the capsule further comprises the sensor or sensors, the sensor being a Hall-effect sensor.

The groove or grooves can be adjacent to the slot antenna, and is/are preferably arranged on an exterior face of the cover, i.e. the face of the cover not facing towards the inner chamber. The sensor, especially a Hall-effect sensor, better detects magnetic fields when arranged in such a groove since fewer alterations of the magnetic fields exist than in the inner face of the cover, in the one or more walls of the capsule, or within the inner chamber.

The sensor can be used for fall detection of the device of the earth moving machine from another device of the earth moving machine, e.g. a wear element like a tooth from another wear element like an intermediate adapter, a weld-on adapter or a mechanically-attached adapter. To this end, the sensor detects magnetic fields from one or more magnets arranged on the other device such that the magnetic fields thereof are measurable by the sensor when the capsule is within the groove.

In some embodiments of the capsule according to the seventh aspect and/or the device according to the eighth aspect, the capsule further comprises a poka-yoke coupling member, either integrally formed on a wall of the capsule or mechanically coupled thereto. In some of these embodiments, the poka-yoke coupling member is a protruding member.

In some embodiments of the capsule according to the seventh aspect and/or the device according to the eighth aspect, an external surface of the one or more walls of the capsule does not comprise a screw thread, i.e. a helical thread.

In some embodiments of the device according to the eighth aspect, the cavity comprises a poka-yoke coupling member adapted to cooperate with a poka-yoke coupling member of the capsule. In some of these embodiments, the poka-yoke coupling member of the cavity is a recess, i.e. a portion of the geometry of the cavity is such that it forms a recess for poka-yoke coupling.

A ninth aspect of the disclosure relates to a process comprising: manufacturing a capsule for protecting an electronic device for an earth moving machine, the capsule comprising one or more walls arranged so as to form both an inner chamber configured for housing an electronic device, and an opening through which the inner chamber is accessible; forming a cover; coupling the cover with the one or more walls so as to at least partially cover the opening; forming the one or more walls such that the capsule comprises a protruding geometry, the protruding geometry being convex and adapted for allowing extraction of the capsule from a cavity of the earth moving machine by rotating the capsule.

A tenth aspect of the disclosure relates to a process comprising: arranging a device for an earth moving machine; forming a cavity in the device; arranging a capsule for protecting an electronic device, the capsule comprising one or more walls arranged so as to form both an inner chamber configured for housing an electronic device, and an opening through which the inner chamber is accessible, the capsule being introducible in the cavity; forming a cover; coupling the cover with the one or more walls so as to at least partially cover the opening; forming the one or more walls such that the capsule comprises a protruding geometry, and both the cavity and the one or more walls are formed such that the protruding geometry fits in at least a portion of a geometry of the cavity, and both the protruding geometry and the portion of the geometry of the cavity are adapted for allowing extraction of the capsule from the cavity by rotating the capsule.

A capsule manufactured with the process of the ninth and/or the tenth aspects features a geometry that allows the extraction of the capsule by way of a rotation motion of the capsule while being within the cavity of a device of an earth moving machine.

In some embodiments, the device is one of: a wear element, digging implements, a boom, a stick, a hydraulic cylinder, traction means, or a cabin.

In some embodiments of the process according to the ninth and/or tenth aspects, the method further comprises rotating the capsule to extract it.

In some embodiments of the process according to the ninth and/or tenth aspects, the cover comprises one or more protruding surfaces, the one or more protruding surfaces extending parallel to a largest surface of the cover; and the method further comprising: introducing the capsule in the cavity such that a first end of the capsule is facing outwards from the cavity; and, while the capsule is introduced in the cavity, arranging an extraction tool on one of the one or more protruding surfaces of the cover and apply torque thereto to extract the capsule from the cavity; the cover being on the first end of the capsule and the protruding geometry protruding towards a second end of the capsule, the second end being opposite the first end.

The extraction tool forces the rotation of the capsule so that the same can be extracted afterwards.

In some embodiments of the process according to the ninth and/or tenth aspects, the method further comprising: introducing the capsule in the cavity such that a first end of the capsule is facing outwards from the cavity; and, while the capsule is introduced in the cavity, applying a force at a point or area of the cover that is offer from a center of the largest surface thereof; the cover being on the first end of the capsule and the protruding geometry protruding towards a second end of the capsule, the second end being opposite the first end.

Owing to the protruding geometry that allows the rotation of the capsule, the application of a force or pressure on the cover but offset from the middle results in a torque that tends to rotate the capsule.

In some embodiments of the process according to the ninth and/or tenth aspect, at least part of the protruding geometry is rounded.

In some embodiments of the process according to the ninth and/or tenth aspects, the capsule is a capsule according to the seventh aspect of the disclosure or the first aspect of the disclosure.

In some embodiments of the process according to the ninth and/or tenth aspects, the process further comprises arranging a sensor in a groove of the cover, said groove being adapted to receive a sensor. In some of these embodiments, the sensor is a Hall-effect sensor. In some of these embodiments, the device is a first device, and the process further comprises: attaching the first device to a second device; and arranging one or more magnets on the second device such that magnetic fields thereof are measurable by the sensor(s) at least while the first device remains attached to the second device (e.g. with a distance between a magnet and a sensor that is less than 5 cm, and/or less than 3 cm, and/or less than 1.5 cm).

The Hall-effect sensor(s) and the magnet(s) provide the devices (e.g. wear elements, a tooth and an adapter, etc.) with one or more of the following capabilities: monitoring an attachment condition of one device to the other, fall detection of one device with respect to the other, monitoring of wear of the devices, etc.

In some embodiments of the process according to the ninth and/or tenth aspects, the second device is a wear element. In some embodiments, the wear element is a tooth. In some embodiments, the wear element is an adapter.

In some embodiments of the process according to the ninth and/or tenth aspects, the process further comprises manufacturing the capsule with a potting process where the potting is carried out in a mold shaped according to the capsule. In some of these embodiments, the mold is the cavity of a device according to the eighth or the second aspect of the disclosure.

An eleventh aspect of the disclosure relates to an assembly comprising a first device according to the eighth aspect of the disclosure, and a second device for an earth moving machine attached or attachable to the first device, the capsule of the first device comprising at least one Hall-effect sensor each on one groove of the cover, and the second device comprising one or more magnets arranged such that each magnet is at a short distance from one Hall-effect sensor when the second device is attached to the first device. Preferably, the distance is short when it is less than 5 cm, and is preferably less than 3 cm, and/or 1.5 cm.

In some embodiments, the second device is a wear element. In some embodiments, the wear element is a tooth. In some embodiments, the wear element is an adapter.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures:

FIGS. 13A-13E diagrammatically show geometries of slot antennas for capsules according to embodiments.

FIG. 18 shows a perspective view of a wear element with magnets arranged therein for cooperating with sensors of capsules in accordance with embodiments.

FIGS. 19A-19B show different views of a capsule according to embodiments.

DESCRIPTION OF WAYS OF CARRYING OUT
THE DISCLOSURE

Figure 1:
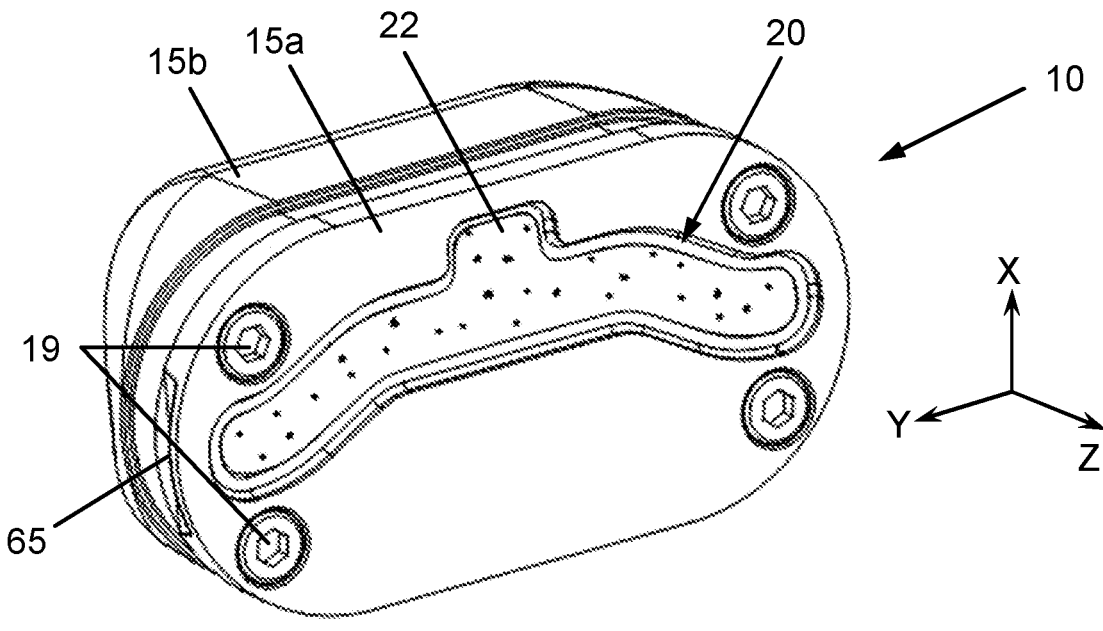
FIG. 1 shows a perspective view of a capsule according to embodiments.

FIG. 1 shows a perspective view of a capsule 10 according to embodiments.

The capsule 10 is adapted for introduction in a wear element of an earth moving machine, preferably in a cavity formed in a wear element. The capsule 10 has two or more walls 15a, 15b, at least one first wall 15a thereof has a slot antenna 20 formed therein. Either the totality of the at least one first wall 15a or at least a portion surrounding the slot of the slot antenna comprises or is made of an electrically conductive material such as metal like e.g. an alloy, thereby enabling the flow of current(s) for radiation and capturing of electromagnetic waves. The capsule 10, when all the walls 15a, 15b thereof are mechanically coupled, has an inner chamber (illustrated in e.g. FIG. 3 as inner chamber 16) adapted for housing and protecting an electronic device (illustrated in e.g. FIG. 3 as electronic device 30). In this embodiment, the slot of the slot antenna 20 is filled with dielectric material 22 so that e.g. soil does not get into the inner chamber.

The first wall 15a (or first walls 15a) has a maximum length in a particular longitudinal direction, in this case along the Y axis illustrated, a maximum width in a particular first transversal direction, in this case along the X axis illustrated, and a thickness in a second transversal direction, in this case along the Z axis illustrated. The slot antenna 20 preferably has a maximum length, which is the length measured along one axis that results in the maximum dimension of the slot antenna 20, in the longitudinal direction that is at least 60% and is less than or equal to 100% of the maximum length of the wall 15a (or walls 15a).

In this example, the first wall 15a is a cover removably couplable to a second wall or walls 15b, which in this case is a single second wall 15b shaped such that it forms a container, whereas, in some other embodiments, two or more second walls 15b are arranged and coupled so as to form the container with the inner chamber 16 therein. The first wall 15a mechanically couples to one or more of the second walls 15b by way of attaching means such as e.g. screws 19. The attaching means of the first wall 15a also include respective threaded through holes, and the second wall(s) 15b include attaching means in the form of respective threaded holes or threaded through holes (not seen in FIG. 4).

The first wall 15a preferably comprises one or more protruding surfaces 65 extending parallel to the largest surface of the first wall 15a; the one or more protruding surfaces 65 preferably comprise or are of a metallic material, e.g. steel. The protruding surface(s) 65 aids in the extraction process of the capsule 10 by supporting a torque applied thereto for rotating the capsule 10.

For the sake of clarity, the X, Y and Z axes represented in FIG. 1 are also represented in the following Figures with the same orientation relative to the elements shown. It will be apparent that other X, Y and Z definitions are also possible without departing from the scope of the present disclosure.

Figure 2:
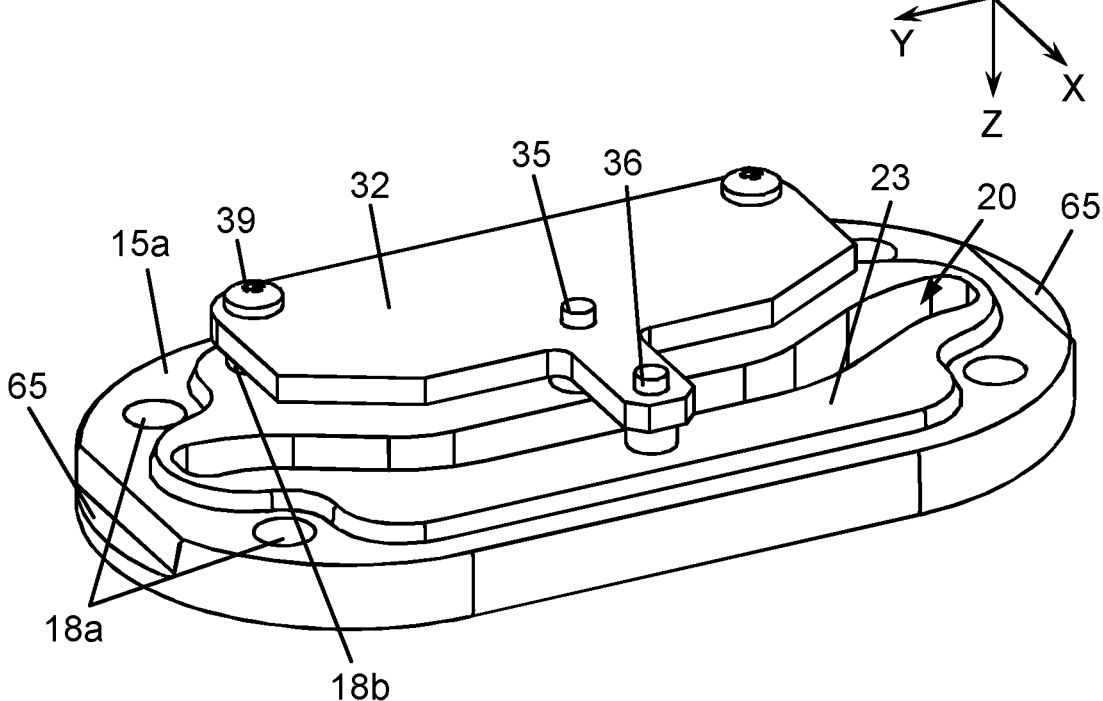
FIG. 2 shows a perspective view of a wall of a capsule according to embodiments, the wall including a slot antenna.

FIG. 2 shows a perspective view of a wall 15a of a capsule 10 according to embodiments, the wall 15a including a slot antenna 20 arranged therein. The side of the wall shown corresponds to an innermost side of the wall 15a, that is to say, it is the side of the wall 15a facing towards an inner chamber of the capsule. In some examples, the wall 15a shown is provided as wall 15a in the capsule 10 of FIG. 1.

In this exemplary embodiment, the wall 15a includes a projecting surface 23 that projects towards the inner chamber when the capsule is provided. The projecting surface 23 can be formed for improving the attachment of the wall 15a to other wall or walls of the capsule for closing the capsule; hence, the projecting surface 23 may result in a hermetic seal of the walls. The slot antenna 20 is also formed in this projecting surface 23.

The wall 15a includes attaching means in the form of threaded through holes 18a for removable coupling with other wall or walls of the capsule, and threaded holes 18b for attachment of a printed circuit board 32, i.e. PCB, of an electronic device. The electronic device includes attaching means as well by way of screws 39 that cooperate with the threaded holes 18b of the wall 15a. The PCB 32, which is arranged parallel to the wall 15a and adjacent thereto, also includes holes for receiving the screws 39. It will be apparent that other attaching means can be used instead of these threaded holes 18a, 18b and respective screws 39.

In this exemplary embodiment, the electronic device connects to the slot antenna 20 by way of the PCB 32, more particularly terminals 35, 36 of the PCB or the wall 15a for feeding the slot antenna 20. The terminals 35, 36 can be, for instance, spring contacts with connectors, soldered terminals as shown in FIG. 2, press-fit contact pads, etc. Likewise, in some embodiments, one or more cables connect the electronic device with the slot antenna 20.

Figure 3:
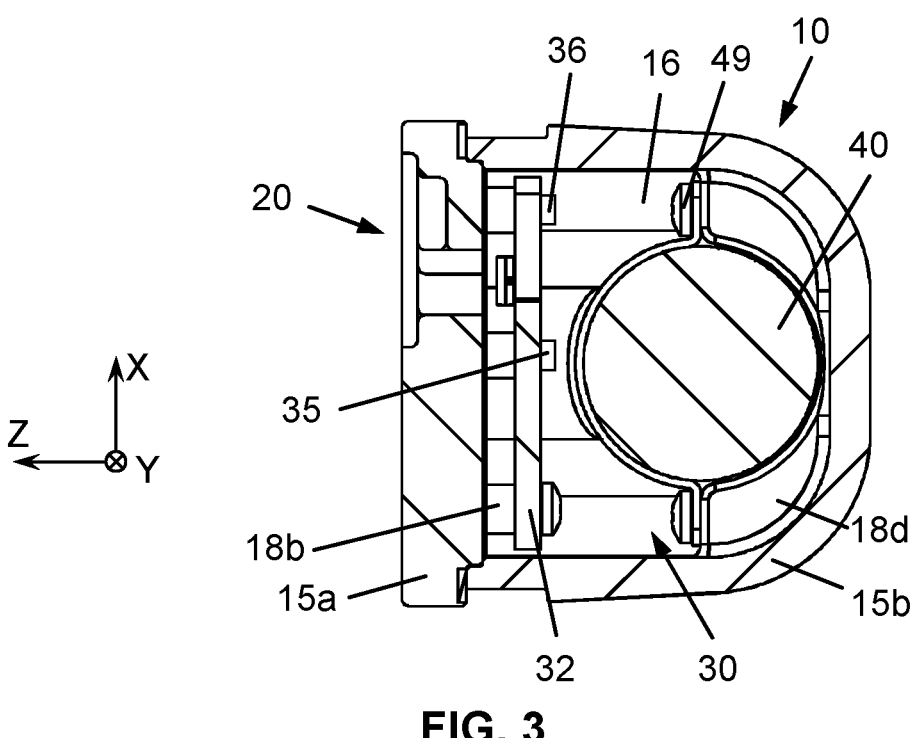
FIG. 3 shows a cross-section of a capsule according to embodiments.

FIG. 3 shows a cross-section of a capsule 10 according to embodiments. The plane intersecting the capsule 10 for the cross-section view is an XZ plane.

Figure 4:
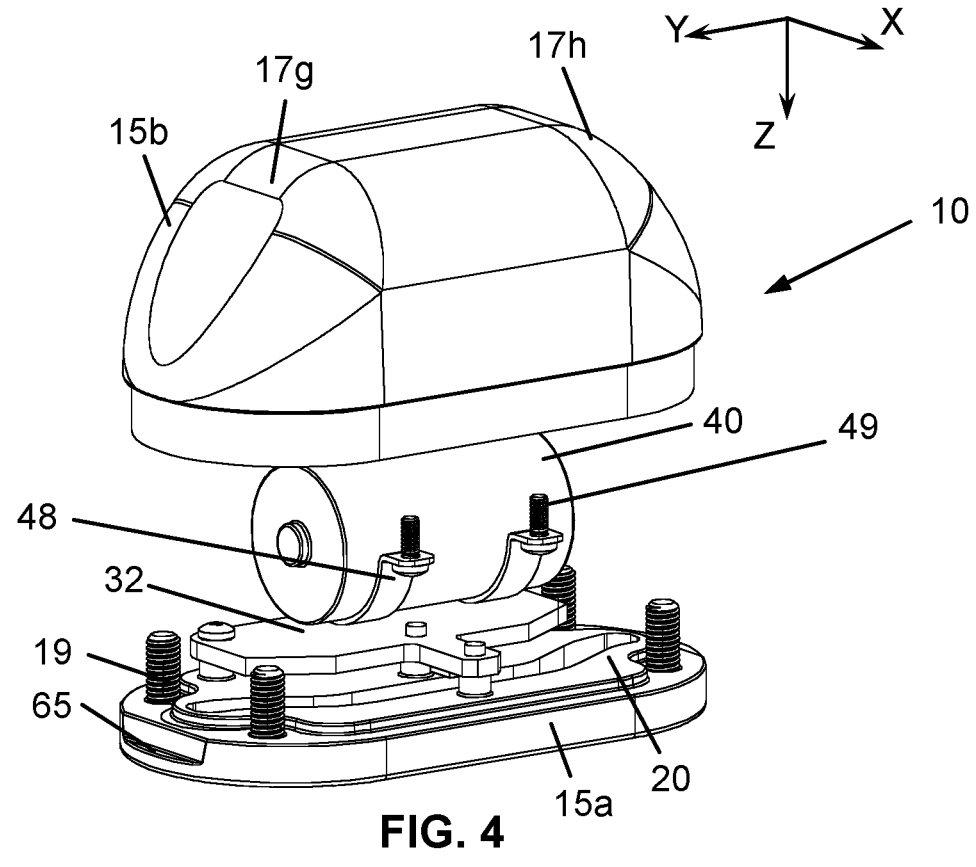
FIGS. 4-6 show perspective views of capsules according to embodiments.

As explained above and best seen in this Figure or in FIG. 4, the second wall 15b has a shape such that it forms a container.

As shown in this Figure, the inner chamber 16 houses and protects the electronic device 30, which includes the PCB 32 and a battery 40. The battery 40 is electrically connected to the PCB 32 for powering the electronic components thereof and the slot antenna 20. The battery 40 remains secured within the inner chamber 16 by way of securing means such as clamps (illustrated in e.g. FIG. 4 as clamps 48), screws 49 and thread holes 18d formed in the second wall 15b.

Additionally, in other embodiments, the capsule 10 comprises a poka-yoke coupling member (for example as described with reference to the embodiments of FIGS. 19A-19B) intended to cooperate with a corresponding member of a cavity where the capsule 10 is to be introduced. Thanks to the poka-yoke couplings members it is ensured that the capsule 10 is introduced in the cavity with a particular orientation.

FIG. 4 shows a perspective view of a capsule 10 according to embodiments.

The attaching means of the wall 15b in the form of threaded holes receive screws 19 for coupling the first wall or cover 15a to the second wall or container 15b.

Although the battery 40 illustrated takes a significant amount of the volume within the inner chamber 16, it will be noted that other types of battery or batteries are also possible within the scope of the present disclosure. By way of example only, one or several button cells can be used.

The second wall or walls 15b of the capsule 10 preferably provide the capsule 10 with a protruding geometry so as to allow a rotation motion whenever the capsule 10 is to be extracted from a cavity. Further, in some embodiments, at least part of the protruding geometry (and, hence, at least part of the second wall or walls 15b) is rounded or chamfered. In this example, two opposite edges 17g, 17h of the second wall or walls 15b are rounded (e.g. arched) so that they can slide along walls of the cavity.

Figure 5:
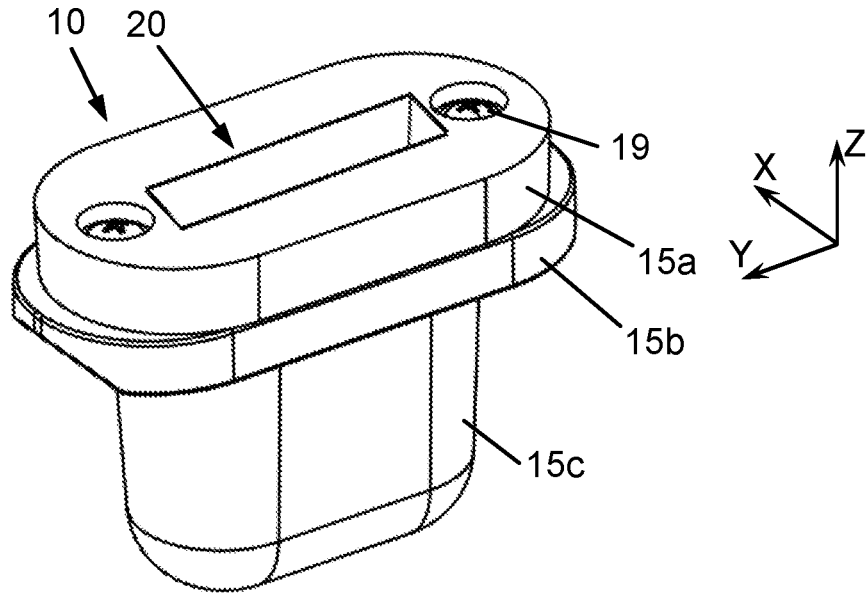

FIG. 5 shows a perspective view of a capsule 10 according to embodiments.

The capsule 10 includes first, second and third walls 15a-15c. The first wall 15a is removably coupled to the second wall 15b of the capsule 10, and the second wall 15b is preferably permanently coupled to the third wall 15c, the latter being shaped like a container for housing an electronic device in a protected manner. The second wall 15b is shaped such that it provides the third wall 15c with a flange, and the first wall 15a has a similar shape for forming a flange as well.

When the capsule 10 is provided with a flange, the removal of the first wall 15a may become easier so as to inspect the interior of the capsule 10, retrieve the contents or replace them, for maintenance purposes or for recycling, for example.

In comparison with the embodiments illustrated in FIGS. 1-4, the slot antenna 20 of the capsule 10 of FIG. 5 is a straight slot antenna with a single straight segment.

Figure 6:
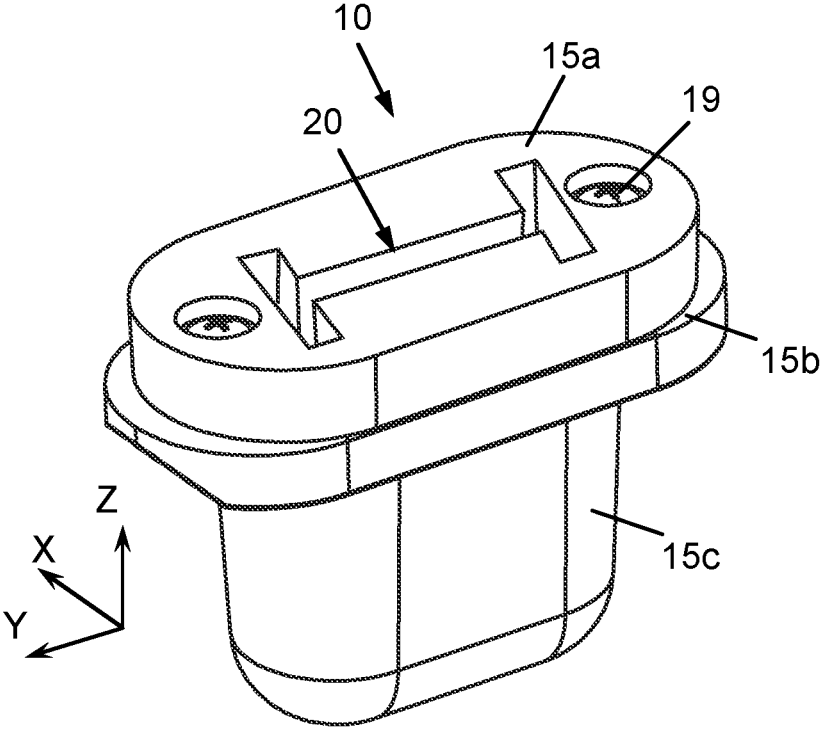

FIG. 6 shows a perspective view of a capsule 10 according to embodiments.

In comparison with the embodiment of FIG. 5, the slot antenna 20 of the capsule 10 of FIG. 6 is not straight and comprises a plurality of segments. In this case, there are three straight segments arranged such that a longitudinal axis of each segment forms an angle different from 0° with respect to the longitudinal axis of the segment or segments it is connected to.

Even though the slot antennas 20 of the embodiments of FIGS. 1-6 are arranged in an exterior wall of the capsule 10, it is noted that slot antennas 20 arranged in one or more interior walls of the capsule 10, or between an interior wall and an exterior wall, are also within the scope of the present disclosure. When the slot antenna is arranged in an interior wall, wall(s) between said interior wall and an opening of the cavity where the capsule is arranged is/are of materials that are non-electrically conductive so as not to produce interference or block the propagation of electromagnetic waves.

Figure 7:
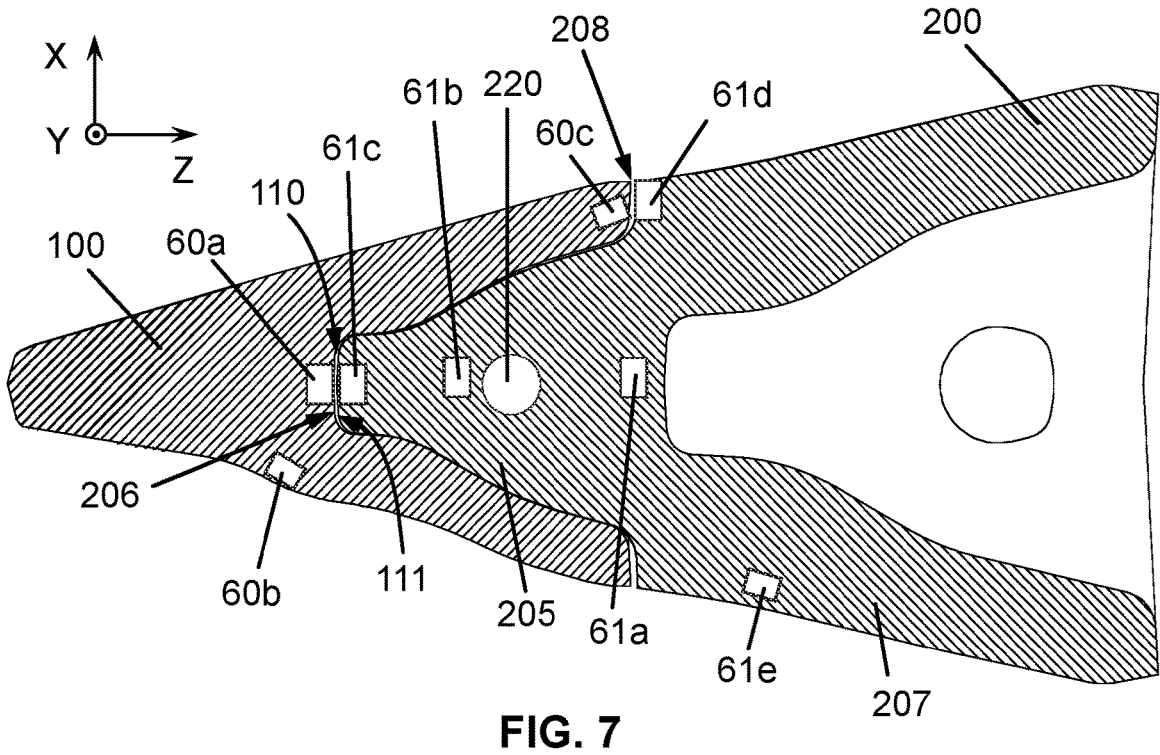
FIG. 7 shows a cross-section of wear elements illustrating positions where cavities for capsules are arrangeable according to embodiments.

FIG. 7 shows a cross-section of wear elements 100, 200 illustrating positions 60a-60c and 61a-61e where cavities for receiving capsules are arrangeable according to embodiments; for the sake of the illustration only, cavity positions 60a-60c and 61a-61e are shown as rectangular polygons for representing possible placement of cavities in accordance with embodiments. The plane intersecting the wear elements 100 and 200 for the cross-section view is an XZ plane. For the sake of clarity only, said plane is illustrated both in FIG. 9 with arrowed line 150, and in FIG. 10 with arrowed line 250.

A first wear element 100 is a tooth 100, and a second wear element 200 is an intermediate adapter 200, but in other embodiments the second wear element is an adapter when a two-part system of wear elements is provided.

The tooth 100 comprises a female portion 110 adapted to receive a male portion 205 of the intermediate adapter 200 when an earth moving machine is to carry out ground engaging operations.

A first position 60a for a capsule receiving cavity (illustrated in FIG. 8 as cavity 126) in the tooth 100 is inside the female portion 110. Preferably, the cavity is formed on a wall 111 of the female portion 110 that is closest to a wear end intended for wearing off with use. The wear end is the front-most part of the tooth 100 and is the end intended to engage ground during operation of the earth moving machine. The wear end is opposite a rear end through which the male portion 205 of the intermediate adapter 200 is received. Both the wear end and the rear end are illustrated in FIG. 8 as wear end 101 and rear end 102.

A second position 60b for a cavity (illustrated in FIG. 9 as cavity 127 with dashed lines for illustration purposes only) in the tooth 100 is an external surface (illustrated in FIG. 9 as external surface 106) that is intended to come into contact with ground during operation of the earth moving machine; namely, the external surface is surface intended to wear off with use.

Figure 8:
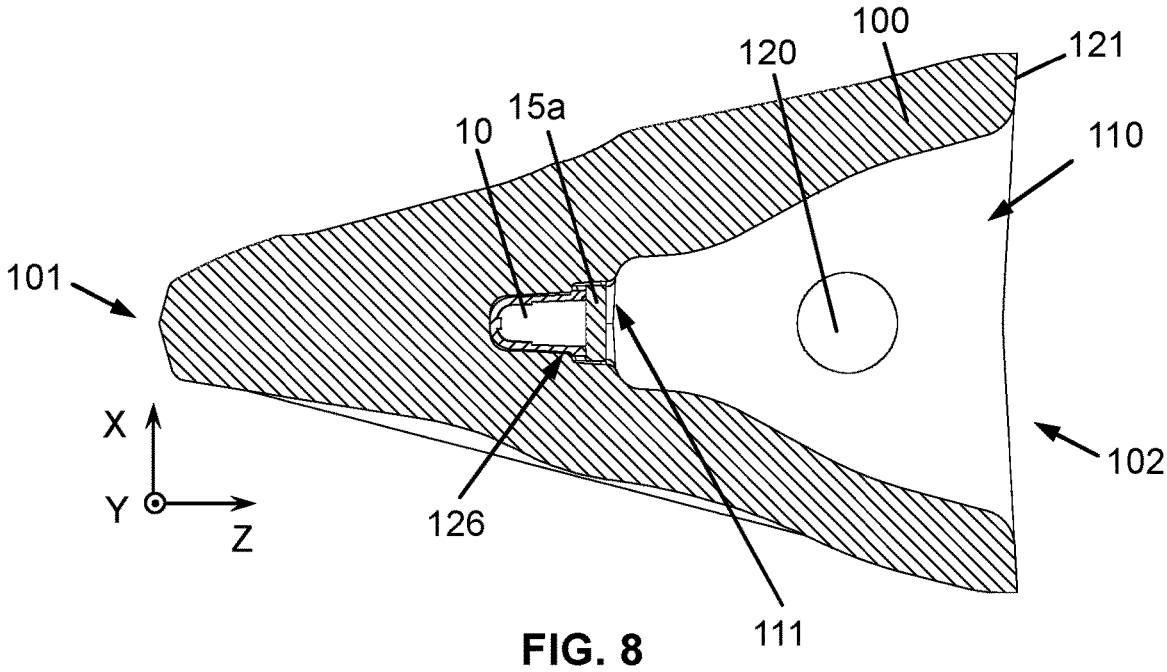
FIG. 8 shows a cross-section view of a tooth with a capsule according to embodiments.
Figure 9:
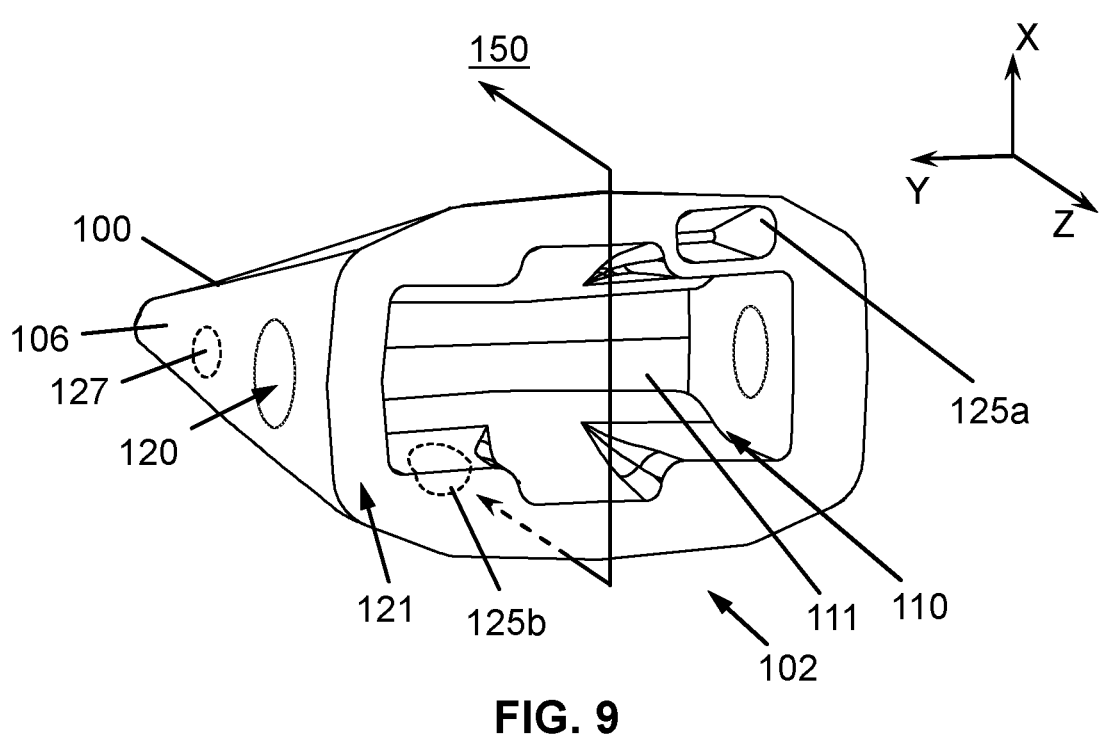
FIGS. 9-10 show perspective views of wear elements.

Another position 60c for a capsule receiving cavity (illustrated in FIG. 9 as cavities 125a, 125b, the latter with dashed lines for illustration purposes only) in the tooth 100 is a surface at the rear end of the tooth 100; with reference to FIGS. 8 and 9, said surface is surface 121. The cavity, which is shown in FIG. 9 as cavity 125a or cavity 125b, is on a side of the rear end that contacts the intermediate adapter 200 when mechanically coupled.

For mechanical coupling of both the tooth 100 and the intermediate adapter 200, the male portion 205 of the intermediate adapter introduces in the female portion 110 of the tooth 100 for receiving the intermediate. While inserted, attaching means in the form of e.g. a pin are introduced in both a through hole (shown with reference sign 120 in FIG. 8) of the tooth 100 and a through hole 220 of the intermediate adapter 200.

First and second positions 61a, 61b for a cavity (illustrated in FIG. 10 as cavities 225, 226, the latter with dashed lines for illustration purposes only) in the intermediate adapter 200 are in the male portion 205. The cavity can be adjacent to the through hole 220 for receiving the pin, and is preferably parallel thereto. The cavity can be arranged either in a portion of the male portion 205 closest to a front end thereof (i.e. the end to be introduced in the female portion 110 of the tooth 100, shown as cavity 226 in FIG. 10) or in a portion of the male portion 205 closest to a rear end thereof. It may be preferable to arrange the cavity according to the latter, i.e. as cavity 225 in the embodiment of FIG. 10, in order to minimize reductions in the mechanical resistance of the male portion 205 on its front end, which generally undergoes higher stress during operation of earth moving machine.

A third position 61c for a cavity (illustrated in FIG. 10 as cavity 227 with dashed lines for illustration purposes only) in the intermediate adapter 200 is the surface 206 of the male portion 205 that is at the frontmost part.

Another position 61d for a cavity (illustrated in FIG. 10 as cavity 228 with dashed lines for illustration purposes only) in the intermediate adapter 200 is the surface 208 of the rear portion 207. Typically said surface 208 is in contact with the rear surface of the tooth 100 thereby blocking the opening of the cavity, in this way the capsule cannot fall out from the cavity even if the attaching means securing the capsule within the cavity fail.

Yet another position 61e for a cavity (illustrated in FIG. 10 as cavity 229 with dashed lines for illustration purposes only) in the intermediate adapter 200 is an external surface (illustrated in FIG. 9 as external surface 106) of the rear portion 207 and which may wear off with use since it comes into contact with ground.

It will be noted that even though FIG. 7 shows a system of wear elements in which the tooth 100 comprises a female portion 110 in its attachment end, and the intermediate adapter 200 comprises a male portion 205 in its first attachment end (namely, the end for attachment to the tooth 100), in another embodiments the system of wear elements comprises same wear elements (or an adapter instead of the intermediate adapter 200) in which the tooth 100 comprises a male portion in its attachment end, and the intermediate adapter 200 comprises a female portion in its first attachment end. In those cases, the positions 60a, 61a-61c for cavities described can be swapped such that they are in the female portion of the intermediate adapter 200 and the male portion of the tooth 100, respectively.

FIG. 8 shows a cross-section view of a wear element 100, particularly a tooth 100, with a capsule 10 according to embodiments. The plane intersecting the tooth 100 and 200 for the cross-section view is an XZ plane like the plane corresponding to arrowed line 150 in FIG. 9.

A cavity 126 is formed inside a female portion 110, in a front-most wall 111 of the female portion 110, that is to say, in a wall 111 closest to the wear end 101; it is noted that, in other embodiments, the cavity 126 is formed in other wall within the female portion 110. As it can be observed, the female portion 110 is shaped and dimensioned for receiving a male portion of an intermediate, whereas the cavity 126 is shaped and dimensioned for receiving the capsule 10. The through hole 120 of the tooth 100 is to be aligned with the through hole of the intermediate adapter when the latter is introduced in the tooth, thereby making possible to mechanically couple both wear elements with a pin.

Preferably, the cavity 126 is shaped such that a cover 15a of the capsule 10 is closest to the rear end 102, particularly when said cover 15a provides the capsule 10 with a flange. Upon removing attaching means of the cover 15a, either while the capsule 10 is within the tooth 100 or once the capsule 10 has been extracted therefrom, personnel can inspect the device(s) and components thereof housed in the capsule 10. It may also be preferable to dimension the cavity 126 and the capsule 10 such that, when the capsule 10 is within the cavity 126 and the slot antenna is formed on e.g. the cover 15a, the slot antenna is flush with the wall 111. It is understood that the slot antenna is flush when an outermost face of the slot antenna is coplanar or almost coplanar with at least a portion of the wall where the opening of the capsule receiving cavity 126 is formed; the face and the wall are almost coplanar when there is a difference in depth smaller than 20 mm, and is preferably less than or equal to 10 mm and/or 5 mm. When not arranged flush with the wall 111, the capsule and the slot antenna are preferably more inwards in the cavity for increasing the protection of both.

FIG. 9 shows a perspective view of a wear element 100, particularly a tooth 100.

In this embodiment, the tooth 100 does not include the capsule receiving cavity of the embodiment of FIG. 9, but includes a cavity 125a formed in surface 121 that is on the rear end 102 of the tooth 100. As seen in FIG. 7, whenever the intermediate adapter 200 gets coupled to the tooth 100, a surface thereof adjacent to the male portion 205 (or female portion when the first attachment end of the intermediate adapter or adapter includes it) becomes in contact with the surface 121 thereby securing the capsule aside from the securing of the attachment means thereof.

In FIG. 9 is also shown, with dashed lines, another possible cavity 125*b* formed in the surface 121 but such that the opening of the cavity is L-shaped. A first portion of the opening is on the surface 121, whereas a second portion of the opening is on a surface within the female portion 110. When the intermediate adapter attaches to the tooth, the two portions of the opening are blocked by the intermediate.

Also, another possible cavity 127 is shown with dashed formed in the external surface 106 of the tooth 100.

Figure 10:
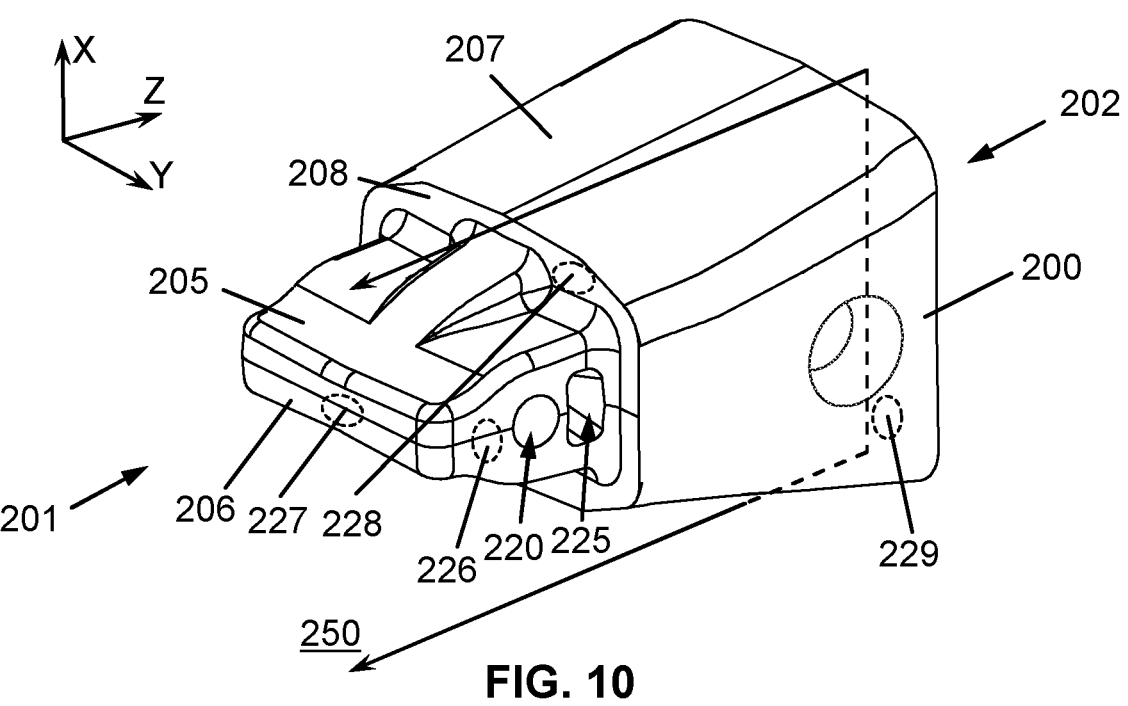

FIG. 10 shows a perspective view of a wear element 200, particularly an intermediate adapter 200, but could equally be an adapter when the system of wear elements is a two-part system.

The intermediate adapter 200 has a front end 201 with the male portion 205 and a rear end 202 with a rear portion 207 that provides a second attachment end for attachment with a blade of the earth moving machine, through an adapter, a weld-on nose, or a cast nose.

A cavity 225 is arranged in the male portion 205 and next to the through hole 220 for the pin. In this case, the cavity 225 is, relative to the through hole 220, closer to the rear end 202 than to the front end 201. By contrast, in other embodiments, a cavity 226 is arranged closer to the front end 201 than to the rear end 202 in comparison with the position of the through hole 220. This part of the male portion 205, which is either proximate to or on the neutral plane, is subjected to less stress and deformation than other parts of the adapter 200, and it also subjected to less lateral hits or of lower intensity than other parts of the adapter 200 too. Moreover, said part of the male portion 205 is less prone to material compaction, which under normal circumstances takes place in surfaces between the teeth and the adapters and where the egress of said material is more difficult, like in the front-most part of the adapter 200. These characteristics make the cavities 225 and 226 next to the through hole 220 convenient for the arrangement of a capsule, not only for increasing the useful life thereof and of the electronic device it protects, but also for both reduced losses in the transmission and reception of wireless signals, and the provision of data about the terrain during operation of the machine resulting from the measurements of the electronic device.

Another possible cavities are shown in the same Figure for illustrative purposes only. By way of example, cavity 227 is shown formed in the surface 206 at the front end 201, i.e. the tooth attaching end. By way of another example, cavity 228 is formed in the surface 208 of the rear portion 207 from which the male portion 205 protrudes. And like in a tooth, another possible cavity 229 is formed in an external surface 229 of the rear portion 207; this surface 229 can contact ground during ground engaging operations.

Figure 11:
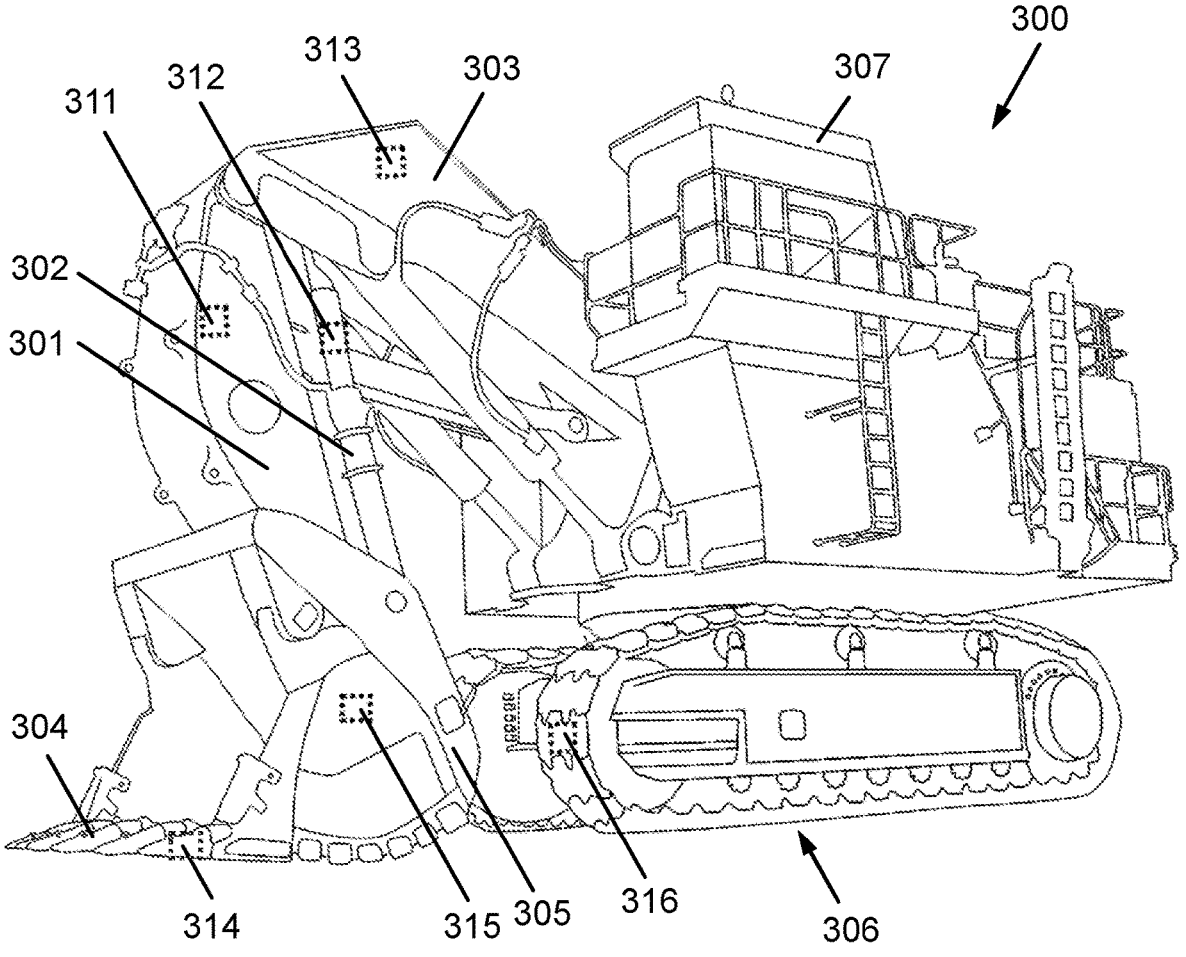
FIG. 11 shows an earth moving machine illustrating devices thereof with positions where capsules can be arranged according to embodiments.

FIG. 11 shows an earth moving machine 300 illustrating devices thereof with positions where capsules can be arranged according to embodiments.

The machine 300 comprises a stick 301, a hydraulic cylinder 302, a boom 303, wear elements 304, digging implements 305, traction means 306 and a cabin 307. A capsule according to the present disclosure is arrangeable in each of these devices 301-307 in different embodiments.

By way of example, capsules can be arranged in a position 311 of the stick 301 that is, for instance, not subject to regular contact with ground during ground-engaging operations, for example in an upper half of the stick 301, and in a similar position 312 along the length of the hydraulic cylinder 302. The capsules can be arranged in a position 313 of the boom 303 that is preferably closest to a joint with the stick 301. The capsules can be arranged in different positions 314 of wear elements 304 as described, for instance, with reference to FIGS. 7-10, and in side faces or the inside 315 of the digging implements. The capsules can be arranged in tracks 316 of continuous tracks of traction means 306, or below the cabin 307.

When capsules are arranged in positions prone to wear, earth compaction or hits, preferably the capsules are arranged in cavities formed in the devices 301-307 in these locations. Otherwise, the capsules can also be arranged directly on the surface of the devices 301-307, namely not in any cavities, in which case the capsules are attached to the devices 301-307 with attaching means like bolts, welding, etc.

FIGS. 12A-12E diagrammatically show cross-sections of capsules 10*a*-10*c* according to embodiments.

Figures 12A, 12B, 12C, 12D, 12E:
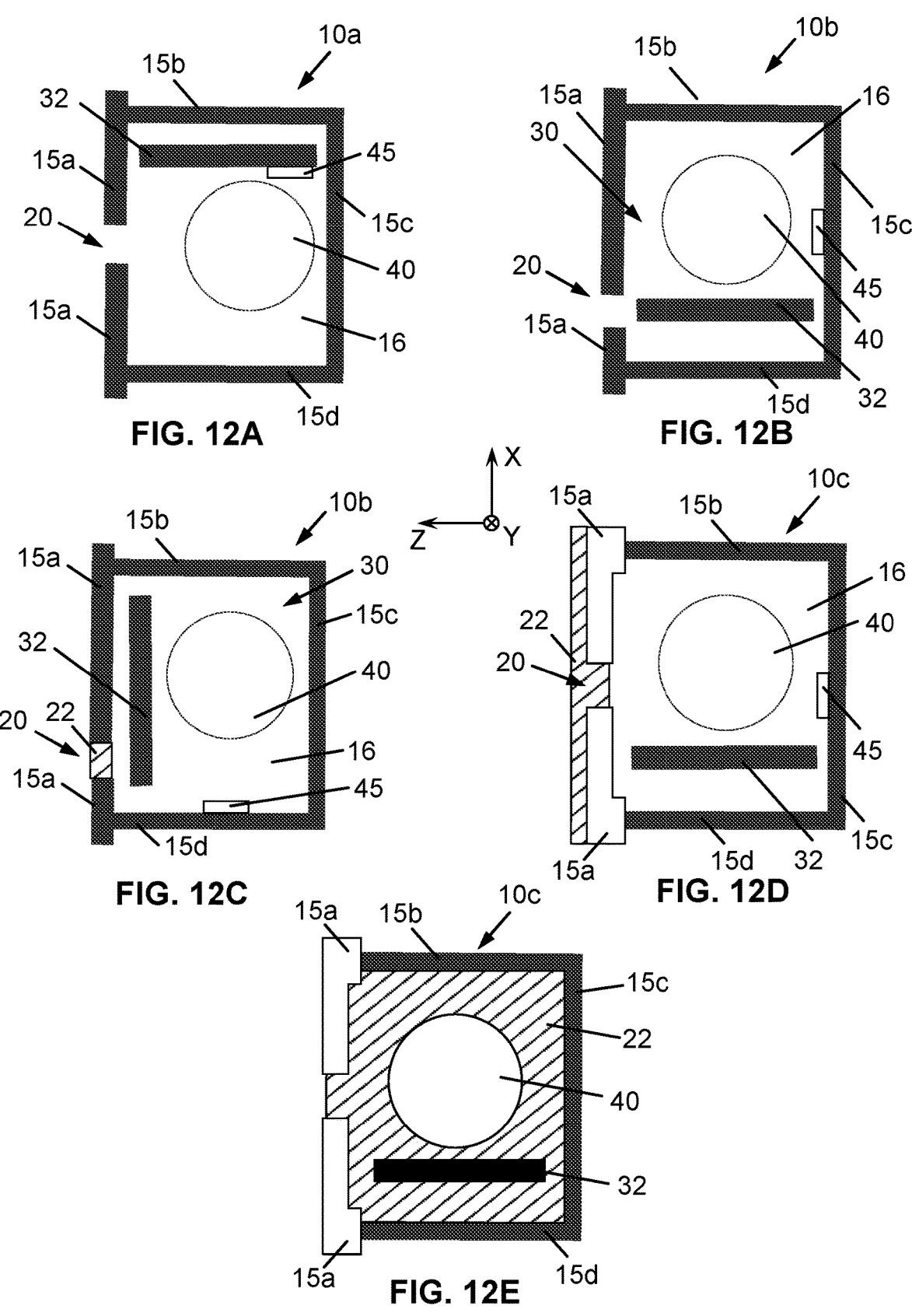
FIGS. 12A-12E diagrammatically show cross-sections of capsules according to embodiments.

In FIG. 12A, the slot antenna 20 of the capsule 10*a* is arranged at the middle in relation to the X axis illustrated. A PCB 32 of the electronic device 30 is arranged oriented along an axial direction (the Z axis illustrated) and is parallel to the slot antenna 20. More particularly, a length of the PCB 32 (along the Z axis illustrated) is parallel to the slot antenna (along the Z axis illustrated). Notwithstanding, the PCB 32 is offset from the position of the slot antenna 20 (along the X axis illustrated). The electronic device 30 preferably also includes at least one sensor 45 soldered on the PCB 32. The at least one sensor 45 may also be remote from the PCB 32 like in FIGS. 12B-12D in which the at least one sensor 45 is attached to a wall of the inner chamber 16, or even remote from the capsule; in these cases, the electronic device 30 comprises an electrical connection and/or a wireless communications link between the at least one sensor 45 and the PCB 32 for sending the measurements, and through the same electrical connection or another one, the battery 40 energizes the at least one sensor if not provided with its own battery.

In FIG. 12B, the slot antenna 20 of the capsule 10*b* is arranged offset from the middle in relation to the X axis illustrated. In this embodiment, the PCB is also oriented along the axial direction, and not only it is parallel to the slot antenna 20 but is also aligned with the slot antenna 20.

In FIG. 12C, the slot antenna 20 is arranged like in the embodiment of FIG. 11B. The PCB 32 is perpendicular to the axial direction and is attached to the wall 15*a* such that at least a portion of the slot antenna 20 is covered by the PCB 32. Such arrangement may ease the electrical connection of the PCB 32 to the slot antenna 20.

The capsules 10 of FIGS. 12A-12C each include four walls 15*a*-15*d*, a first wall 15*a* where the slot antenna 20 is provided, and second, third and fourth walls 15*b*-15*d* mechanically coupled (preferably in a permanent manner, for example welded together) to form a container. The first wall 15*a* can be removably coupled to the second and fourth walls 15*d*. In these examples, the wall 15*a* containing the slot antenna 20 comprises, either in an area surrounding the slot or in an entirety of the wall, electrically conductive material so that the slot antenna 20 is capable of radiating and capturing electromagnetic waves. When not an entirety of the wall 15*a* comprises the electrically conductive material, one or more portions thereof may comprise other material like e.g. resin. The remaining walls, i.e. walls may comprise electrically conductive or non-conductive material.

In this example, a couplable lid or cap of dielectric material 22 is arranged in the slot of the slot antenna 20. The lid or cap can be attached to the walls delimiting the slot with e.g. adhesive or attaching means.

In FIG. 12D, the capsule 10c comprises at least one wall 15a where the slot antenna is provided that is of electrically conductive material, and the at least one wall 15a is coupled with other walls 15b-15d of a different material, either electrically conductive or non-conductive. In this example, a couplable lid or cap of dielectric material 22 is provided on the at least one wall 15a where the slot antenna 20 is arranged. The lid or cap can be attached to the wall 15a of the capsule with e.g. adhesive or attaching means.

In FIG. 12E, the capsule 10c comprises the same walls 15a-15d and slot antenna, but instead of a couplable lid or cap, the dielectric material 22 fills the entirety of the inner chamber 16 in addition to the slot of the slot antenna 20.

In similar embodiments, the dielectric material 22 forms the walls (e.g. the walls 15b-15d not including the slot antenna 20, or all the walls 15a-15d) and also fills the inner chamber 16, thus the walls and the inner chamber filled are made of a single piece; in this sense, the outer faces of the filling are walls of the capsule. Such capsules can be produced, for instance, with a potting process.

In other embodiments, the PCB 32, a sensor attached or connected to the PCB 32 and/or the battery 40 may be outside the inner chamber 16, for instance in another cavity formed to receive said component(s), or can be attached to one of the walls 15a-15d of the capsule 10 from the outside. In these embodiments, the electrical connection between component(s) outside the inner chamber 16 and component(s) within the inner chamber 16 can be made by way of e.g. one or more cables, flexible printed circuit boards, etc.

It is to be noted that the slot antenna 20 of embodiments such as those described with reference to FIGS. 12A-12E can be formed in the space existing between two or more adjacent walls. By way of example, the top and bottom walls 15a illustrated in FIGS. 12A-12E can each be a separate wall and arranged such that the slot is present between the two walls 15a, thereby forming a slot antenna 20 when at least the portion surrounding the slot is electrically conductive. This means the slot antenna 20 thanks to two or more walls 15a and the way they are coupled together.

FIGS. 13A-13E diagrammatically show geometries of slot antennas 20a-20e for capsules according to embodiments. The slot antennas 20a-20e can be formed in one or more walls of the capsules.

A first slot antenna 20a is a straight slot antenna owing to a single segment 21a thereof, which furthermore is straight in this example. The capsule of FIG. 5 includes a slot antenna like the first slot antenna 20a.

A second slot antenna 20b comprises three segments 21a-21c arranged such that a middle-most first segment 21a is connected, on a first end thereof, to a second segment 21b and, on a second end thereof, to a third segment 21c. With regards to the first and third segments 21a, 21c, longitudinal axes have been represented with dashed lines for illustrative purposes only. Likewise, an angle 22 formed between said longitudinal axes is represented. A similar representation could be made in respect of the first and second segments 21a, 21b. The smallest or the largest angle 22 could be measured too, but it is clear that whichever the angle 22 that is measured, the longitudinal axes form an angle different from 0°.

A third slot antenna 20c comprises three segments 21a-21c arranged such that a middle-most first segment 21a is connected, on respective ends thereof, to second and third segments 21b, 21c such that angles of 90° are formed. As shown in this example, the segments 21a-21c do not necessarily have to be connected at ends thereof, but they can be connected at some point along the length of the segments. The capsule of FIG. 6 includes a slot antenna like the third slot antenna 20c.

A fourth slot antenna 20d comprises five segments 21a-21e. A middle-most first segment 21a is connected, on a first end thereof, to a second segment 21b, in turn connected to a third segment 21c that is parallel to the first segment 21a. The middle-most first 21a is connected, on a second end thereof, to a fourth segment 21d, which in turn is connected to a fifth segment 21e that is parallel to the first segment 21a.

Another slot antenna 20e comprises a plurality of segments 21a-21e including five segments. The arrangement of the segments 21a-21e is somewhat similar to the arrangement of the fourth slot antenna 20d but, in this example, the third and fifth segments 21c, 21e extend inwardly. In this way, the length of the wall or walls where the slot antenna 20e is arranged is reused by the slot antenna 20e to lengthen the radioelectric length thereof, that is to say, to lengthen the path that currents will follow for radiating and/or capturing electromagnetic waves. In this case, said path is the concatenation of all segments 21a-21e, thus the length thereof is the sum of the lengths of the segments 21a-21e.

The different arrangements of the second, third, fourth and fifth slot antennas 20b-20e are intended to increase an effective length of the slot antenna 20 based on, for example, a size of the wall of the capsule in which they are formed. In this way, the frequency of operation of the slot antenna 20 can be reduced with a wall featuring a minor length.

Although the exemplary slot antennas 20a-20e of FIGS. 13A-13E have straight segments, in other embodiments similar or different slot antenna geometries can be arranged in which one, some or all segments thereof are curvilinear. Likewise, it is not necessary that the slot antennas 20a-20e feature symmetry and can even have an irregular geometry. The slot antennas may also feature a meander-like geometry intended to make use of a greater portion of the surface of the wall or walls where it is arranged to increase the radioelectric length.

In some embodiments, the maximum dimension of the slot antenna 20 (of embodiments such as, but without limitation, any one of those of FIGS. 1 to 6, 12A to 12E and 13A to 13E) is at least 40 mm. In some embodiments, the maximum dimension of the slot antenna 20 (of embodiments such as, but without limitation, any one of those of FIGS. 1 to 6, 12A to 12E and 13A to 13E) is equal to or less than 115 mm. By maximum dimension it is meant the greatest edge of a rectangle (like the rectangle 25 shown with dashed lines in FIG. 13D, but it is readily apparent that a similar rectangle 25 can be drawn for any other slot antenna) enclosing a shape of the slot 20 with sides of the rectangle being tangent to the slot with reference to the rectangle 25 of FIG. 13D, the maximum dimension corresponds to the length of the edge indicated with letter L, which is greater than the length of the edge indicated with letter W.

The maximum dimension of the slot antenna affects the radioelectric performance thereof for different frequencies, thereby increasing or reducing the gain at each frequency.

In some embodiments, the maximum width of the at least one of the walls where the slot antenna 20 (of embodiments such as, but without limitation, any one of those of FIGS. 1 to 6, 12A to 12E and 13A to 13E) is arranged has a width of at least 20 mm. In some embodiments, the width is at most 60 mm. A rectangle enclosing the at least one wall may be drawn like the rectangle 25 for a slot antenna, but with sides of the rectangle tangent to the at least one wall; the maximum width in these cases is the length of the edge that is shortest out of the edges of the rectangle, that is to say, that corresponding to the length W shown in FIG. 13D but with a rectangle for the at least one wall. The rectangle is thus drawn with respect to a particular longitudinal direction and a first transversal direction of the at least one wall.

The width of the wall or walls affect the gain of the slot antenna; the width is measured along the direction of the two perpendicular directions that closes the capsule and has a shortest length between said two perpendicular directions.

In some embodiments, the at least one of the walls where the slot antenna 20 (of embodiments such as, but without limitation, any one of those of FIGS. 1 to 6, 12A to 12E and 13A to 13E) has a thickness of at least 1.0 mm and, preferably, is less than or equal to mm. In some embodiments, the thickness is between 2.0 mm and 8.0 mm, the endpoints being included in the range. The thickness is the third dimension of the wall that is not included in the rectangle enclosing the at least one wall, namely the thickness in in a second transversal direction.

The thickness of the wall or walls can be selected based upon the expected strains or wear that the capsule is to undergo during ground engaging operations based on the location of the capsule on the earth moving machine. The thickness is measured along the direction towards the inside of the inner chamber and, thus, is not any one of the two perpendicular directions that closes the capsule, i.e. those of the maximum length and maximum width. It has been found out that thicknesses within the aforesaid range has little or no influence on the gain of the slot antenna.

Figures 14A, 14B, 14C:
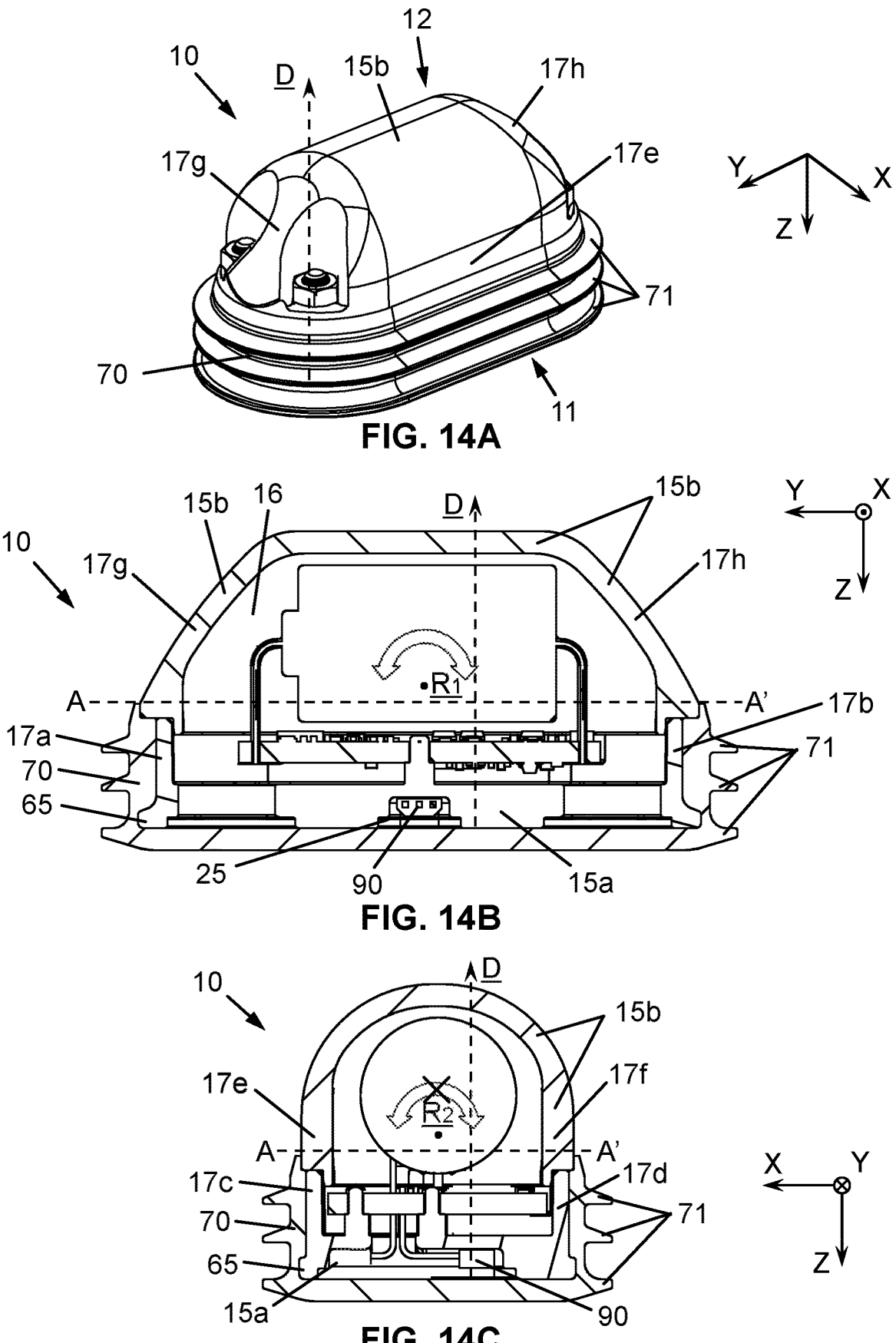
FIGS. 14A-14C show different views of a capsule according to embodiments.

FIG. 14A shows a perspective view of a capsule 10 according to embodiments, and FIGS. 14B and 14C show two different cross-sections of the capsule 10.

The capsule 10 comprises one or more walls 15b that enclose an inner chamber 16. A cover 15a (for example, but without limitation, the first wall 15a of FIGS. 1-6 and 12A-12E) on a first end 11 of the capsule 10 is to be mechanically coupled with the one or more walls so as to at least partially cover an opening through which the inner chamber 16 is accessible. In some embodiments, the cover 15a comprises a slot antenna, for example the slot antenna 20 as described with reference to previous Figures.

The one or more of the walls 15b on a second end 12 of the capsule 10 provide the capsule 10 with a protruding geometry, that is to say, a geometry that provides the inner chamber 16 with additional room. In this example, this geometry protrudes along a protruding direction D (shown with a dashed arrow for illustrative purposes only) going from the first end 11 to the second end 12, which corresponds to the negative part of the Z axis illustrated. Within the context of the present disclosure, protruding geometries preferably refer to geometries in which a cross-section of the capsule progressively becomes smaller (the further away the taken transversal cross-section is along the protruding direction D, in this case the closer the taken transversal cross-section is to the arrow end), and which preferably have a shape of an arch or alike, as in the embodiment of FIG. 14A-14C.

The protruding geometry, which is convex, is adapted to allow the extraction of the capsule 10 by rotating the capsule 10 while introduced in a cavity; the rotation being at least around a first rotation axis R₁ (shown in FIG. 14B together with a rotation arrow for the sake of clarity only). Said geometry furthermore provides the inner chamber 16 with a concave geometry, thereby having more volume for allocating the electronic device to be protected by the capsule. At least part of the protruding geometry (and, hence, at least part of one or more walls 15b) is rounded as it can be appreciated from the different views; two opposite edges 17g, 17h of the wall 15b that are to slide along walls of the cavity are rounded, for example arched or substantially arched. A rounded geometry further eases the extraction of the capsule 10 thanks to the reduced friction or collisions existing between the wall(s) 15b and the walls of the cavity where the capsule 10 is introduced.

The cover 15a preferably comprises one or more protruding surfaces 65 extending parallel to the largest surface (shown in FIG. 16 as surface 80) of the cover 15a; the one or more protruding surfaces 65 preferably comprise or are of a metallic material, e.g. steel. As it will be seen in FIGS. 15A-15B, the protruding surface(s) 65 aids in the extraction process of the capsule 10 by supporting a torque applied thereto for rotating the capsule 10.

The capsule 10 may further comprise a cap 70 that includes one or more protrusions 71 or fins. The protrusion(s) 71 or fin(s) produce additional friction between the capsule 10 and the cavity to maintain the capsule 10 more reliably therewithin. In addition, the cap 70 blocks the entry of particles within the inner chamber 16 in those embodiments in which cover include an opening, for example a slot antenna, or includes one or more cavities 25 for receiving a sensor 90, for example a Hall-effect sensor. In order to more reliably couple the cap 70 to the cover 15a and the latter includes the one or more protruding surfaces 65, the cap 70 may include a recess in which the protruding surface(s) 65 fits.

Further, one or more edges 17a-17d of the cover 15a and/or one or more edges 17e-17f of the one or more walls 15b preferably extend perpendicular to the largest surface of the cover 15a, i.e. the surface at least partially covering the opening of the capsule 10. As it can be seen in FIGS. 14A-14C, the edges 17a-17f extend along the (negative) Z axis illustrated, whereas the largest surface of the cover 15a extends along the X and Y axes illustrated, that is to say, it extends according to a plane defined by X and Y axes illustrated. These edges 17c-17f preclude the capsule 10 from rotating around a second rotation axis R₂ (shown in FIG. 14C together with a crossed rotation arrow for the sake of clarity only).

In this example, the one or more walls 15b is shaped such that it has two symmetry planes extending between the first and second ends 11, 12. According to the axes illustrated in FIGS. 14A-14C, a first symmetry plane is plane Y-Z, and a second symmetry plane is plane X-Z.

It can be appreciated from the representation of the capsule 10 of FIGS. 14A-14C that a longitudinal axis thereof is parallel to the Y axis illustrated, and width and depth axes of the capsule 10 are parallel to the X and Z axes illustrated. The width axis can be either the X or the Z axis, and the depth axis be the other one of the X or the Z axis; preferably, but not necessarily, the depth axis corresponds to the axis of the capsule 10 featuring a maximum length measured along said axis shorter than the maximum length measured along the longitudinal axis, and longer than the maximum length measured along the width axis, which in this example means that the depth axis is parallel to the Z axis, and the width axis is parallel to the X axis.

Figure 15A:
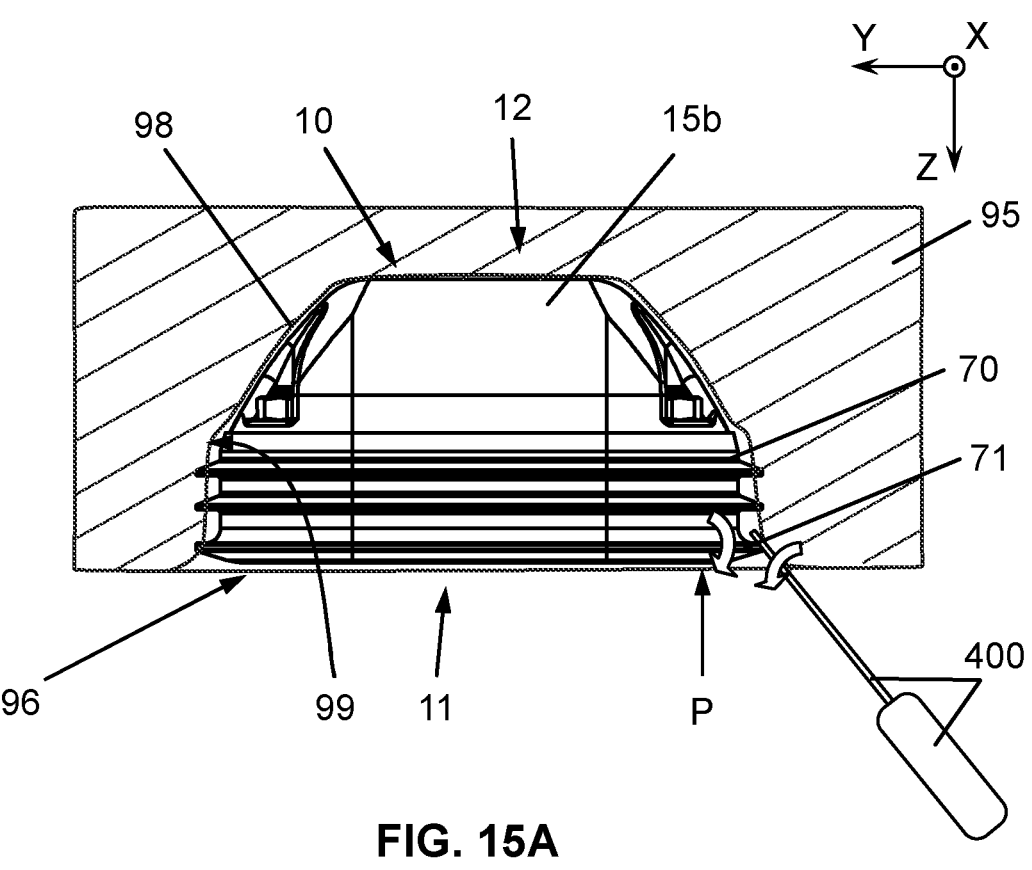
FIGS. 15A-15B show the extraction of a capsule according to embodiments.
Figure 15B:
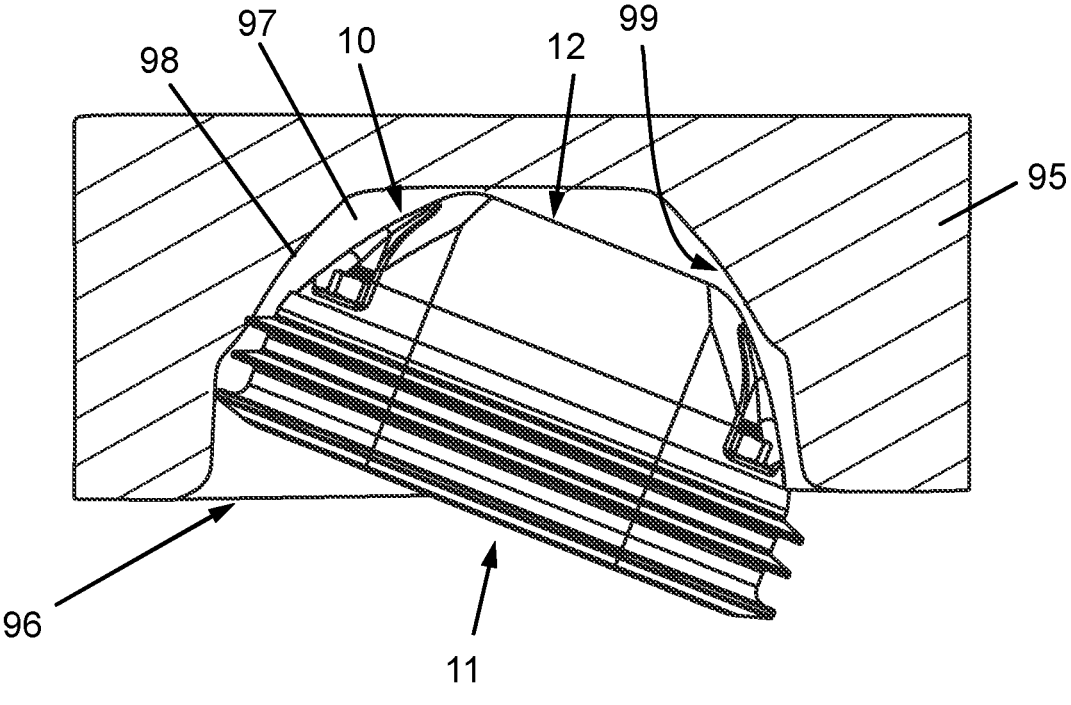

FIGS. 15A-15B show the extraction of a capsule 10 according to embodiments, for example the capsule 10 of FIGS. 14A-14C. In FIG. 15A shows how an extraction tool 400 can be used to force the rotation movement of the capsule 10 while being within a cavity 97 of a device 95 for an earth moving machine, and FIG. 15B shows the capsule 10 after being subjected to a rotation movement. The rotation of the extraction tool 400 and the rotation of the capsule 10 are shown with arrows for illustrative purposes only, which are counterclockwise and clockwise, respectively.

In FIG. 15A it can be observed that the protruding geometry of the one or more walls 15b of the capsule 10 fits in at least a portion of a geometry 98 of the cavity 97, that is to say, the protruding geometry and the geometry 98 are complementary or have partially corresponding geometries, thereby enabling the capsule 10 to rotate within the cavity 97 as seen in FIG. 15B. Some free volume may exist between the one or more walls 15b and the walls 99 of the cavity 97 featuring the geometry 98, even though this free volume can be reduced whenever the respective geometries have a greater matching correspondence.

While the capsule 10 is within the cavity 97, in the embodiments in which the capsule comprises a cap 70 arranged thereon, and the cap 70 comprises protrusions 71 or fins, these protrusions 71 or fins may contact walls 99 of the cavity 97 and produce additional friction to keep the cavity introduced therein. This can be advantageous during operation of the earth moving machine owing to the strong hits that it is subjected to and which could cause the falling off of the capsule 10, and even while the machine is not operating, for example when the device is to be coupled to another part of the machine. In some cases, the device is manufactured with the capsule 10 inside the cavity, and then the device is to be coupled to the machine, or the capsule 10 is first introduced in the cavity before the device is coupled to the machine; in both cases, during the installation of the device in the machine the capsule 10 could fall off if not properly attached to the cavity. The additional friction likewise provides a stronger coupling of the capsule 10 within the cavity 97, in turn enhancing the measurements of strains or stresses by sensors included in the capsule 10.

The extraction tool 400 is partially introduced in the cavity 97 and brought about to contact a protruding surface 65 of the cover 15a, or the cap 70 if provided and is covering said protruding surface 65. Then, the extraction tool 400 is rotated towards an opening 96 of the cavity 97, or in other words, towards an extraction direction. The extraction tool 400 thus applies torque on the protruding surface 65 and, as a result, the capsule 10 tends to rotate within the cavity 97. Following the rotation and as seen in FIG. 15B, the capsule 10 does not have the surface of the first end 11 thereof lying flat with respect to the opening 96 of the cavity 97; and when the capsule 10 and the cavity 97 are dimensioned such that said surface of the capsule 10 is flush with the opening 96, like in this example as seen in FIG. 15A, the rotation makes the capsule 10 not to remain flush anymore, something that facilitates grabbing part of the capsule 10 to pull it out from the cavity 97.

Additionally, or alternatively when the cover 15a does not have the protruding surfaces the rotation of the capsule can be forced by applying a force on the surface (which is the largest surface of the cover 15a, or the cap 70 when provided and covering the cover 15a) at the first end 11 of the capsule 10 at a point or area offset from the middle, and preferably at a point or area that results in a greater torque, like point or area P illustrated for the sake of clarity only (if the force were to be applied at point or area P, the capsule 10 would rotate in the direction opposite to that illustrated in FIG. 15A, therefore it would rotate counterclockwise). When more free volume exists between the walls of the capsule 10 and the walls of the cavity 97, the easier it is to force the rotation by applying said force.

In this example, the geometry 98 of the cavity 97 is such that it has two symmetry planes. According to the axes illustrated in FIG. 15A, a first symmetry plane is plane Y-Z, and although not seen in FIGS. 15A-15B, a second symmetry plane is plane X-Z.

Figure 16:
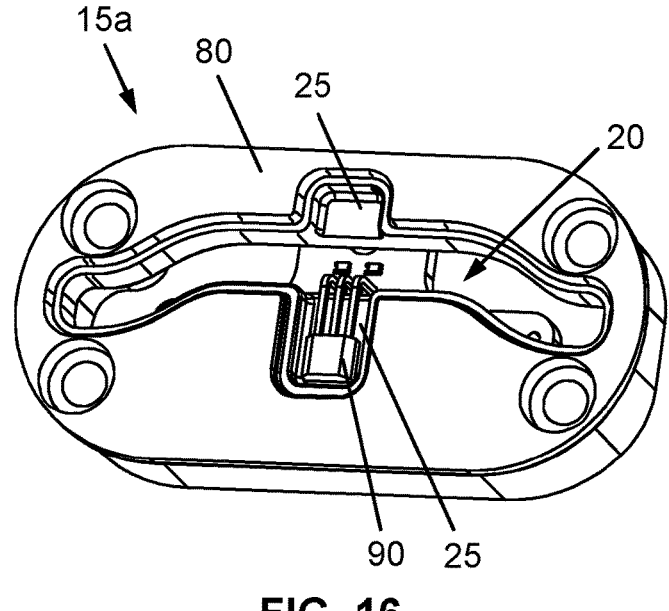
FIG. 16 shows a perspective view of a wall of a capsule according to embodiments, the wall including a slot antenna and cavities for installing a sensor.

FIG. 16 shows a perspective view of a cover 15a of a capsule 10 according to embodiments, the cover 15a including a slot antenna 20 and grooves 25 for installing a sensor 90.

The sensor 90 is e.g. a Hall-effect sensor that is arranged on an external part of the capsule so that magnetic fields produced by magnets remote from the capsule can be measured more accurately. A plurality of grooves 25 can be formed on the largest surface 80 to allow selective arrangement of the sensor 90, which provides flexibility in the positioning of the sensor 90 and, therefore, better adapt to the position of the magnet since that may be different in each case, or for receiving multiple sensors 90.

Since the grooves 25 are outside of the projection of slot antenna 20, the electromagnetic waves radiated by the slot antenna 20 produce little or no interference at all with the measurements of the sensor 90. Likewise, any blocking that the slot antenna 20 may cause on the magnetic fields produced by the magnets does not affect the measurements because the grooves 25 are on the external face of the largest surface 80 of the wall 15a; the magnetic fields arrive from outside of the capsule 10.

Figure 17:
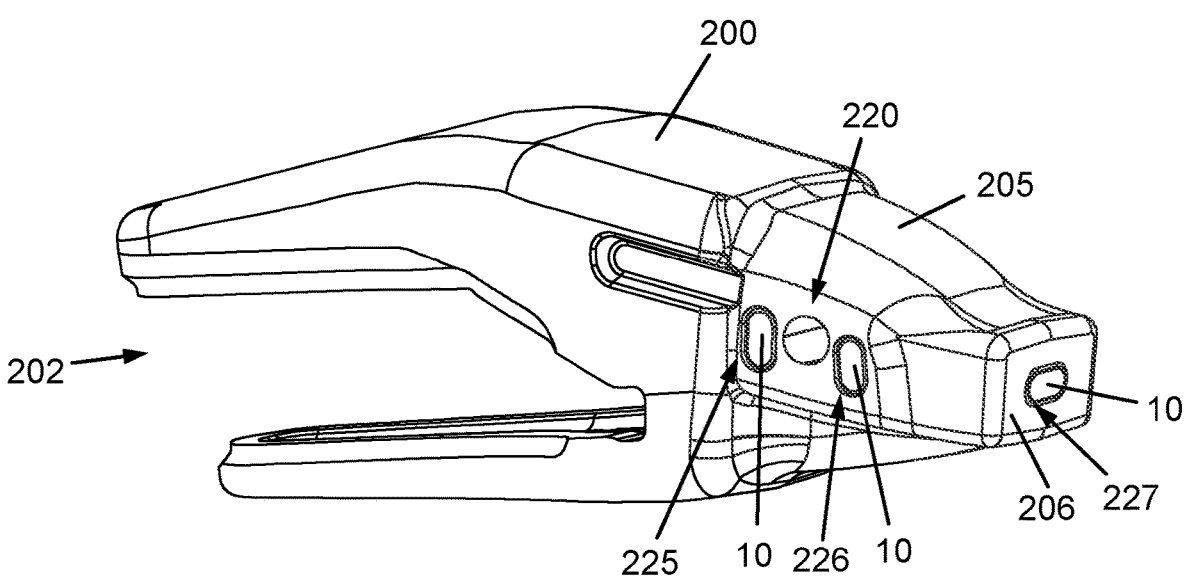
FIG. 17 shows a perspective view of a wear element with capsules arranged therein in accordance with embodiments.

FIG. 17 shows a perspective view of an intermediate adapter 200 with capsules 10 arranged therein in accordance with embodiments.

Although in this embodiment three cavities 225-227 are shown with capsules 10 therein, in other embodiments only one or two such cavities 225-227 with a capsule 10 are provided, or one or more cavities as described with reference to FIG. 10 are provided for receiving respective one or more capsules 10.

One of the cavities 225 is adjacent to the through hole 220 for receiving a pin for mechanically coupling the adapter 200 with a tooth, and is at a rear end of the through hole 220, that is to say, it is between the through hole 220 and the rearmost end 202 of the adapter 200.

Another cavity 226 is also adjacent to the through hole 220, but is at a front end thereof, that is to say, it is between the through hole 220 and a tooth engaging end 201.

The other one of the cavities 227 is arranged on the surface 206 of the male portion 205 at the tooth engaging end 201.

FIG. 18 shows a perspective view of a tooth 100 with magnets 91 arranged therein for cooperating with sensors of capsules in accordance with embodiments.

A capsule receiving cavity 126 in the tooth 100 is inside the female portion 110. A magnet 91 is attached to a side wall 112 of the capsule receiving cavity 126 where a through hole 120 is formed for receiving a pin that couples an adapter with the tooth 100. The magnet 91 is preferably at a rear end of the through hole 120, that is to say, it is between the through hole 120 and the rearmost end 102 of the tooth 100.

Additionally or alternatively, a magnet 91 is attached to a wall 111 of the capsule receiving cavity 126 that is closest to a wear end intended for wearing off with use.

The position of the magnet(s) 91 is in correspondence with the position of the capsule(s), and preferably in correspondence with the position of Hall-effect sensor(s) of the capsule(s), thereby making possible to detect falling off of wear elements. In this example, the position of the two magnets 91 is in correspondence with the position of the capsules 10 arranged in the adapter 200 of FIG. 17. When the cover of the capsule(s) 10 comprises several grooves for receiving sensors, a groove can be selected over another based on the position of the corresponding magnet 91.

Assemblies that comprise two or more cooperating devices such as wear elements can be formed so that the assemblies include fall detecting capabilities. By way of example, the tooth 100 and adapter 200 of FIGS. 17-18 form an assembly with one or more capsules including one or more Hall-effect sensors in one of the devices, and respective one or more magnets 91 in the other one of the devices.

FIG. 19A shows a perspective view of a capsule 10 according to embodiments, and FIG. 19B shows a side view of the capsule 10.

The capsule 10 comprises a poka-yoke coupling member 55 arranged on an edge 17 of a wall 15b of the capsule 10. In this example, the poka-yoke coupling member 55 is integrally formed on the wall 15b, which means that the geometry of the wall 15b, in addition to being adapted for allowing extraction by way of a rotation movement, has the poka-yoke coupling member 55.

The poka-yoke coupling member 55 is a protruding member that cooperates with a poka-yoke coupling member, in the form of a recess, in a cavity receiving the capsule 10. The cavity including said poka-yoke coupling member can be any one of the cavities described with reference to previous Figures.

In this example, the poka-yoke coupling member 55 includes a flat surface 56 for casting feeding, and likewise has a radiated geometry 57 that makes possible to disassemble the capsule, even in presence of e.g. compacted fines. Therefore, the member 55 may also improve the operation of the capsule 10 beyond forbidding incorrect arrangement of the capsule 10 in a cavity.

Figure 20:
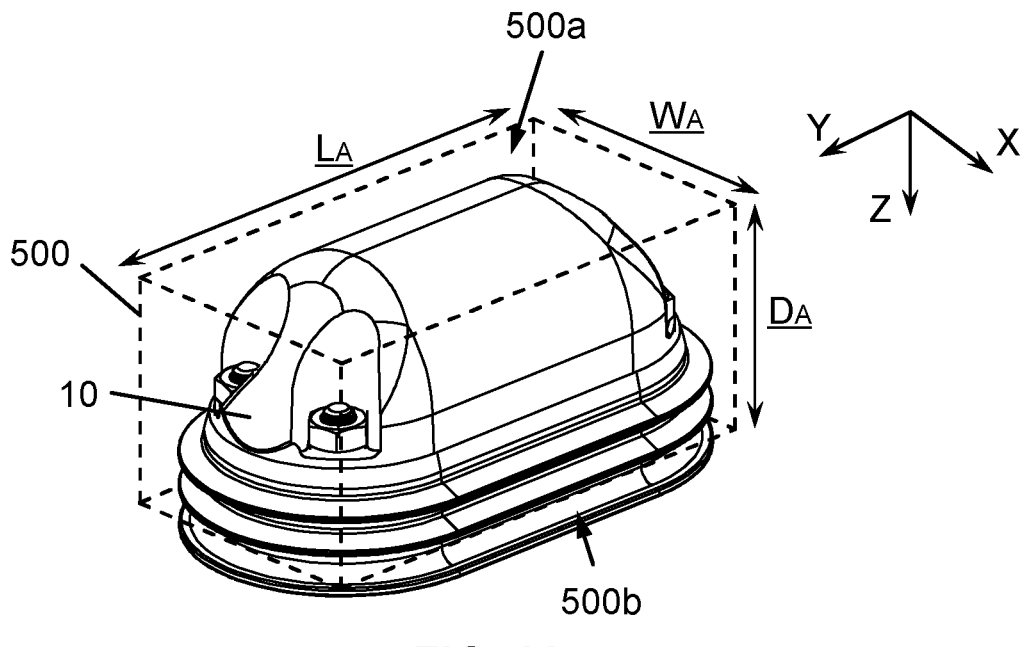
FIG. 20 shows an imaginary box tangentially enclosing a capsule according to embodiments.

FIG. 20 shows an imaginary box 500 enclosing a capsule 10 according to embodiments.

The imaginary box 500 is represented with dashed lines for illustrative purposes only. The box 500 is a cube or a square cuboid with each of its six faces thereof being tangent to at least one point on the outer surface of at least one wall of the capsule 10. The imaginary box 500 is the box 500 having the minimum volume possible, i.e. the box 500 that simultaneously has faces tangent to at least one point on the outer surface of at least one wall of the capsule and is minimally-sized. When the capsule 10 includes a cap 70 like in the embodiments of FIG. 20, one or more faces of the box 500 may go through the cap 70 or not even touch it.

Longitudinal, transverse and vertical axes (the latter two being also referred to as width and depth axes, or depth and width axes) of the capsule 10, and preferably of the geometry formed by the walls thereof, can be, for instance, defined by way of the imaginary box 500. In that case, the longest edge of the box 500 corresponds to a longitudinal axis of the capsule (in this example, the longest edge is parallel to axis Y and has length $L_A$, said length $L_A$ is likewise the maximum length measured along the longitudinal axis); a width axis of the capsule 10 preferably corresponds to an edge perpendicular thereto, and it is preferably the edge defining a plane containing (or parallel to a plane containing) with the end of a convex portion of the geometry of the capsule 10 (in this example, it defines top face 500a) and/or containing (or parallel to a plane containing) the opening of the capsule 10 (in this example, it defines bottom face 500b), which, in this example, is parallel to axis X and has length $W_A$, said length $W_A$ is likewise the maximum length measured along the width axis; and a depth axis of the capsule 10 preferably corresponds to an edge perpendicular to both edges corresponding to the longitudinal and width axes, in this example being parallel to axis Z and having length $D_A$, said length $D_A$ is likewise the maximum length measured along the depth axis. The length of the edge corresponding to the longitudinal axis is greater than the length of the other two edges.

In some preferred embodiments, the length of the edge corresponding to the width axis is shorter than the length of the edge corresponding to the depth axis. In some embodiments, the length of the edges corresponding to the width and depth axes is equal. In some less preferred embodiments, the length of the edge corresponding to the width axis is longer than the length of the edge corresponding to the depth axis.

Figure 21:
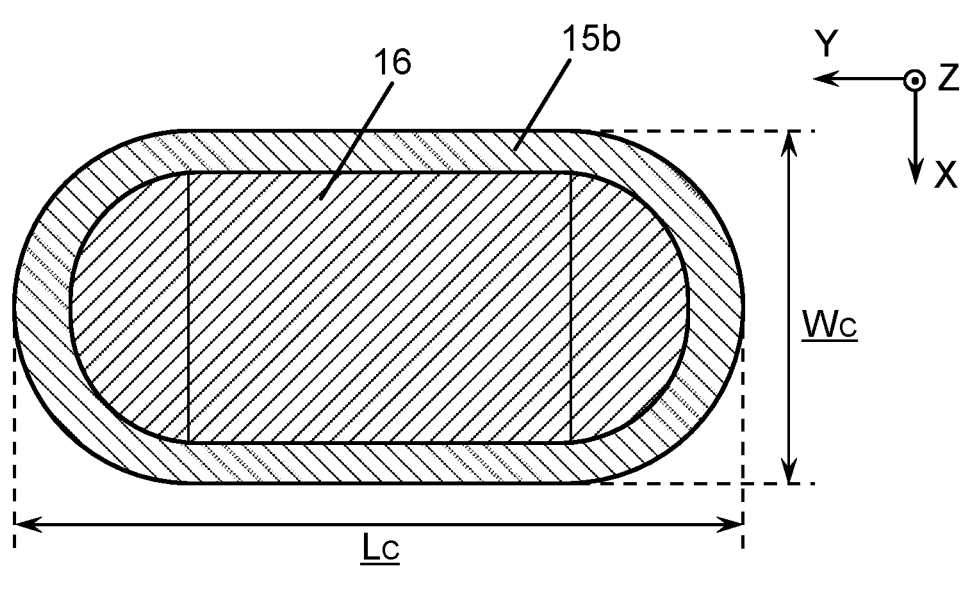
FIG. 21 shows a cross-section of walls forming a capsule according to embodiments in a portion thereof providing the capsule with a geometry that is convex.

FIG. 21 shows a cross-section of walls 15b forming a capsule according to embodiments in a portion thereof providing the capsule with a geometry that is convex. Particularly, the cross-section is with respect to plane represented as A-A' in FIGS. 14B and 14C, and the view of FIG. 21 is in the protruding direction D shown in FIGS. 14B and 14C, i.e. towards the inside of the capsule.

The walls 15b enclose a two-dimensional area extending from the outermost side of the walls 15b and including the projection of the cavity 16, thus said area covers the entirety of the surface shown with striped patterns. Said area extends in the cross-section plane that is defined by two axes: the longitudinal axis (corresponding to the Y axis illustrated) and the width axis (corresponding to the X axis illustrated) of the capsule 10 as described e.g. with reference to FIG. 20. A length of the area along the longitudinal axis is shown as $L_c$ and the length of the area along the width axis is shown as $W_c$.

It can be appreciated from FIGS. 14B, 20 and 21 that the rotation axis $R_1$ is parallel to the width axis described.

In this text, the term "protruding geometry" has been used for the sake of the clarity only; the corresponding geometry of the wall or walls could as well have been named "geometry", "shape", or "form" without departing from the scope of the present disclosure.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

What is claimed is:

1. A capsule for protecting an electronic device for an earth moving machine, the capsule comprising one or more walls arranged so as to form both an inner chamber configured for housing the electronic device, and an opening through which the inner chamber is accessed, the opening being at least partially covered by a cover, wherein the one or more walls provide the capsule in at least one portion thereof with a geometry that is convex and adapted for allowing extraction of the capsule from a cavity of the earth moving machine by rotating the capsule about a rotation axis, wherein a cross-section of the capsule where the at least one portion starts extends over a plane, the plane being defined by both a longitudinal axis of the capsule and an axis transverse thereto, wherein the rotation axis is parallel to the axis transverse to the longitudinal axis.

2. The capsule of claim 1, wherein an external surface of the one or more walls does not comprise a screw thread.

3. The capsule of claim 1, wherein the cover is on a first end of the capsule and the geometry is convex towards a second end of the capsule, the second end being opposite the first end.

4. The capsule of claim 1, wherein the cover comprises one or more protruding surfaces for allowing an extraction tool to apply torque thereon for extraction of the capsule from the cavity, the one or more protruding surfaces extending parallel to a largest surface of the cover.

5. The capsule of claim 1, wherein the capsule further comprises a cap removably couplable to the cover, the cap comprising one or more protrusions for contacting walls of the cavity.

6. The capsule of claim 1, wherein the one or more walls are shaped such that the capsule comprises the longitudinal axis, a width axis, and a depth axis, wherein the width and depth axes are perpendicular to each other and both are perpendicular to the longitudinal axis; wherein a first maximum length of the capsule measured along the longitudinal axis is greater than both a second maximum length of the capsule measured along the width axis and a third maximum length of the capsule measured along the depth axis.

7. The capsule of claim 1, wherein the capsule has a cuboid shape and two opposite edges of the one or more walls are rounded or chamfered.

8. The capsule of claim 1, wherein the cover is provided with one or more edges, and the one or more edges are perpendicular to a largest surface of the cover.

9. The capsule of claim 1, wherein the cover comprises a slot antenna.

10. The capsule of claim 1, wherein the cover comprises one or more grooves each adapted to receive a sensor.

11. A device for an earth moving machine comprising:
a cavity; and
a capsule comprising one or more walls arranged so as to form both an inner chamber configured for housing an electronic device, and an opening through which the inner chamber is accessed, the opening being at least partially covered by a cover, wherein the one or more walls provide the capsule in at least one portion thereof with a geometry that is convex and adapted for allowing extraction of the capsule from the cavity by rotating the capsule about a rotation axis;
wherein a cross-section of the capsule where the at least one portion starts extends over a plane, the plane being defined by both a longitudinal axis of the capsule and an axis transverse thereto;
wherein the rotation axis is parallel to the axis transverse to the longitudinal axis;
wherein the capsule is introducible in the cavity;
wherein the geometry of the at least one portion of the capsule fits in at least one portion of the cavity, and the geometry of the at least one portion of the cavity is adapted for allowing extraction of the capsule from the cavity by rotating the capsule about the rotation axis.

12. The device of claim 11, wherein the geometry of both the at least one portion of the capsule and the at least one portion of the cavity are adapted for allowing the extraction of the capsule from the cavity with application of a force or pressure on the cover offset from the middle of the cover that results in a torque that tends to rotate the capsule to be extracted about the rotation axis.

13. The device of claim 11, wherein the device is one of: a wear element, digging implements, a boom, a stick, a hydraulic cylinder, traction means, or a cabin.

14. The device of claim 11, wherein the device is a wear element comprising an adapter or an intermediate adapter, the adapter or the intermediate adapter having a male portion adapted for insertion into a female portion of a tooth and delimiting a first end of the wear element, and a rear portion delimiting a second end of the wear element, wherein the cavity is arranged in a location in the male portion, the location being:
a surface at a tooth engaging end; or
adjacent to a through hole of the adapter or intermediate adapter for receiving a pin for mechanically coupling the adapter or the intermediate adapter with the tooth, and between the through hole and the second end; or
adjacent to the through hole, and between the through hole and the tooth engaging end.

15. An assembly comprising:
a first device for an earth moving machine, and a second device for the earth moving machine;
wherein the first device comprises: a cavity, and a capsule comprising one or more walls arranged so as to form both an inner chamber configured for housing an electronic device, and an opening through which the inner chamber is accessed, the opening being at least partially covered by a cover, wherein the one or more walls provide the capsule in at least one portion thereof with a geometry that is convex and adapted for allowing extraction of the capsule from the cavity by rotating the capsule about a rotation axis;
wherein a cross-section of the capsule where the at least one portion starts extends over a plane, the plane being defined by both a longitudinal axis of the capsule and an axis transverse thereto;
wherein the rotation axis is parallel to the axis transverse to the longitudinal axis;
wherein the capsule is introducible in the cavity;
wherein the geometry of the at least one portion of the capsule fits in at least one portion of the cavity, and the geometry of the at least one portion of the cavity is adapted for allowing extraction of the capsule from the cavity by rotating the capsule about the rotation axis;
wherein the second device is attached or attachable to the first device;
wherein the capsule of the first device comprises at least one Hall-effect sensor, each Hall-effect sensor of the at least one Hall-effect sensor being arranged on one groove of one or more grooves of the cover, and the second device comprising one or more magnets arranged such that each magnet is at a distance from one Hall-effect sensor when the second device is attached to the first device, the distance being less than 5 cm.

16. The assembly of claim 15, wherein the second device is a wear element.

17. A method comprising: manufacturing a capsule for protecting an electronic device for an earth moving machine, the capsule comprising one or more walls arranged so as to form both an inner chamber configured for housing said electronic device, and an opening through which the inner chamber is accessible; forming a cover; coupling the cover with the one or more walls so as to at least partially cover the opening; forming the one or more walls such that the capsule comprises, in at least one portion thereof, a geometry that is convex and adapted for allowing extraction of the capsule from a cavity of the earth moving machine by rotating the capsule about a rotation axis, wherein a cross-section of the capsule where the at least one portion starts extends over a plane, the plane being defined by both a longitudinal axis of the capsule and an axis transverse thereto, wherein the rotation axis is parallel to the axis transverse to the longitudinal axis.

18. The method of claim 17, wherein the capsule is manufactured with a potting process where the potting is carried out in a mold shaped according to the capsule.

19. The method of claim 18, further comprising: arranging a device for the earth moving machine; forming the cavity in the device, wherein the capsule is introducible in the cavity, wherein the cavity is formed such that the geometry of the at least one portion of the capsule fits in at least one portion of the cavity, wherein a geometry of the at least one portion of the cavity is adapted for allowing extraction of the capsule from the cavity by rotating the capsule about the rotation axis.

20. The method of claim 19, wherein the device is a wear element comprising an adapter or an intermediate adapter, the adapter or the intermediate adapter having a male portion adapted for insertion into a female portion of a tooth and delimiting a first end of the wear element, and a rear portion delimiting a second end of the wear element, wherein the cavity is arranged in a location in the male portion, the location being:

a surface at a tooth engaging end; or adjacent to a through hole of the adapter or intermediate adapter for receiving a pin for mechanically coupling the adapter or the intermediate adapter with the tooth, and between the through hole and the second end; or adjacent to the through hole, and between the through hole and the tooth engaging end.

* * * * *